(12) United States Patent
Dutta et al.

(10) Patent No.: US 12,740,445 B2
(45) Date of Patent: Sep. 15, 2026

(54) INTEGRATED DEVICES COUPLED TO INTERPOSER COMPRISING POROUS PORTION

(71) Applicant: QUALCOMM Incorporated, San Diego, CA (US)

(72) Inventors: Ranadeep Dutta, Del Mar, CA (US); Jonghae Kim, San Diego, CA (US); Je-Hsiung Lan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 448 days.

(21) Appl. No.: 18/468,533

(22) Filed: Sep. 15, 2023

(65) Prior Publication Data

US 2025/0096093 A1 Mar. 20, 2025

(51) Int. Cl.

| | |
|---|---|
| ***H10W 70/63*** | (2026.01) |
| ***H10W 70/65*** | (2026.01) |
| ***H10W 70/68*** | (2026.01) |
| ***H10W 90/00*** | (2026.01) |

(52) U.S. Cl.

CPC ......... *H10W 70/635* (2026.01); *H10W 70/65* (2026.01); *H10W 70/68* (2026.01); *H10W 90/00* (2026.01); *H10W 90/722* (2026.01); *H10W 90/724* (2026.01)

(58) Field of Classification Search

CPC ... H01L 23/13; H01L 24/14; H01L 23/49827; H01L 23/49838

See application file for complete search history.

(56) References Cited

U.S. PATENT DOCUMENTS

| | | | | |
|---|---|---|---|---|
| 9,728,490 | B2 | 8/2017 | Choi et al. | |
| 10,134,837 | B1 | 11/2018 | Fanelli et al. | |
| 2007/0210417 | A1* | 9/2007 | Binder | H01L 23/49827 257/E23.079 |
| 2010/0032808 | A1 | 2/2010 | Ding et al. | |
| 2013/0020719 | A1 | 1/2013 | Jung et al. | |
| 2015/0108643 | A1 | 4/2015 | Kim et al. | |
| 2015/0140807 | A1 | 5/2015 | Mohammed et al. | |
| 2018/0277632 | A1* | 9/2018 | Fanelli | H01L 21/30604 |
| 2019/0244946 | A1 | 8/2019 | Kim | |
| 2021/0111101 | A1* | 4/2021 | Howard | H01L 23/562 |
| 2022/0375865 | A1* | 11/2022 | Pietambaram | H01L 24/73 |
| 2023/0080862 | A1 | 3/2023 | Choi et al. | |

(Continued)

FOREIGN PATENT DOCUMENTS

WO 2012145373 A1 10/2012

OTHER PUBLICATIONS

Faivre C., et al., "X-Ray Diffraction Investigation of the Low Temperature Thermal Expansion of Porous Silicon", Journal of Applied Physics, American Institute of Physics, 2 Huntington Quadrangle, Melville, NY 11747, vol. 87, No. 5, Mar. 1, 2000, pp. 2131-2136, XP012049552, table I.

(Continued)

*Primary Examiner* — Steven M Page

(74) *Attorney, Agent, or Firm* — Loza & Loza, LLP

(57) ABSTRACT

A package comprising an interposer comprising a silicon substrate comprising a porous portion; and a plurality of via interconnects extending through the porous portion of the silicon substrate. The package includes a first integrated device coupled to the interposer through a first plurality of solder interconnects.

20 Claims, 17 Drawing Sheets

CROSS SECTIONAL PROFILE VIEW

(56) References Cited

U.S. PATENT DOCUMENTS

| | | | | |
|---|---|---|---|---|
| 2023/0137691 | A1* | 5/2023 | Lai | H01L 23/145 257/701 |
| 2025/0096090 | A1 | 3/2025 | Dutta et al. | |

OTHER PUBLICATIONS

International Search Report and Written Opinion—PCT/US2024/044842—ISA/EPO—Oct. 25, 2024.

* cited by examiner

CROSS SECTIONAL PROFILE VIEW

CROSS SECTIONAL PROFILE VIEW

CROSS SECTIONAL PROFILE VIEW

Z
Y
303
302
304
305
120
103
423
308
340
320
330
130a
342
307
108
422
323
400
106a
132a
102
101
CROSS SECTIONAL PROFILE VIEW

INTEGRATED DEVICE

CARRIER 304
302
305
307
308
340
320
342
900
1
2

FORM INTERCONNECTS

304

302

305

900

340

307

308

320

342

932

8

FORM DIELECTRIC LAYER

INTEGRATED DEVICES COUPLED TO INTERPOSER COMPRISING POROUS PORTION

FIELD

Various features relate to interposers and substrates in a package.

BACKGROUND

A package may include a substrate and integrated devices. These components are coupled together to provide a package that may perform various electrical functions. The performance of a package and its components may depend on the number and/or density of interconnects that may be provided in an integrated device, an interposer, a substrate and/or a package. There is an ongoing need to provide packages with higher density interconnects and/or more interconnects in a given region.

SUMMARY

Various features relate to interposers and substrates in a package.

One example provides a package comprising an interposer comprising a silicon substrate comprising a porous portion; and a plurality of via interconnects extending through the porous portion of the silicon substrate. The package includes a first integrated device coupled to the interposer through a first plurality of solder interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 9A-9F illustrate an exemplary sequence for fabricating an integrated device that includes a die substrate with a porous portion and a cavity.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising an interposer comprising a silicon substrate comprising a porous portion; and a plurality of via interconnects extending through the porous portion of the silicon substrate. The package includes a first integrated device coupled to the interposer through a first plurality of solder interconnects. The first integrated device may include a die substrate comprising a porous portion; a plurality of through substrate vias extending through the porous portion of the die substrate; and a die interconnection portion coupled to the die substrate. The silicon substrate may include an unporosified portion, and the porous portion of the silicon substrate may include a lower density than the unporosified portion of the silicon substrate. In some implementations, the porous portion comprises a first porous portion comprising a first density; and a second porous portion comprising a second density. In some implementations, the first porous portion comprises a first coefficient of thermal expansion (CTE), and the second porous portion comprises a second coefficient of thermal expansion (CTE) that is different from the first coefficient of thermal expansion (CTE). The use of a porous portion in the silicon substrate allows for more through substrate vias in the silicon substrate than would otherwise be possible, due to the reduction in CTE mismatch between the CTE of the plurality of via interconnects and the CTE of the silicon substrate. More via interconnects means higher density interconnects, which can lead to improved performance in the package.

Figure 1:
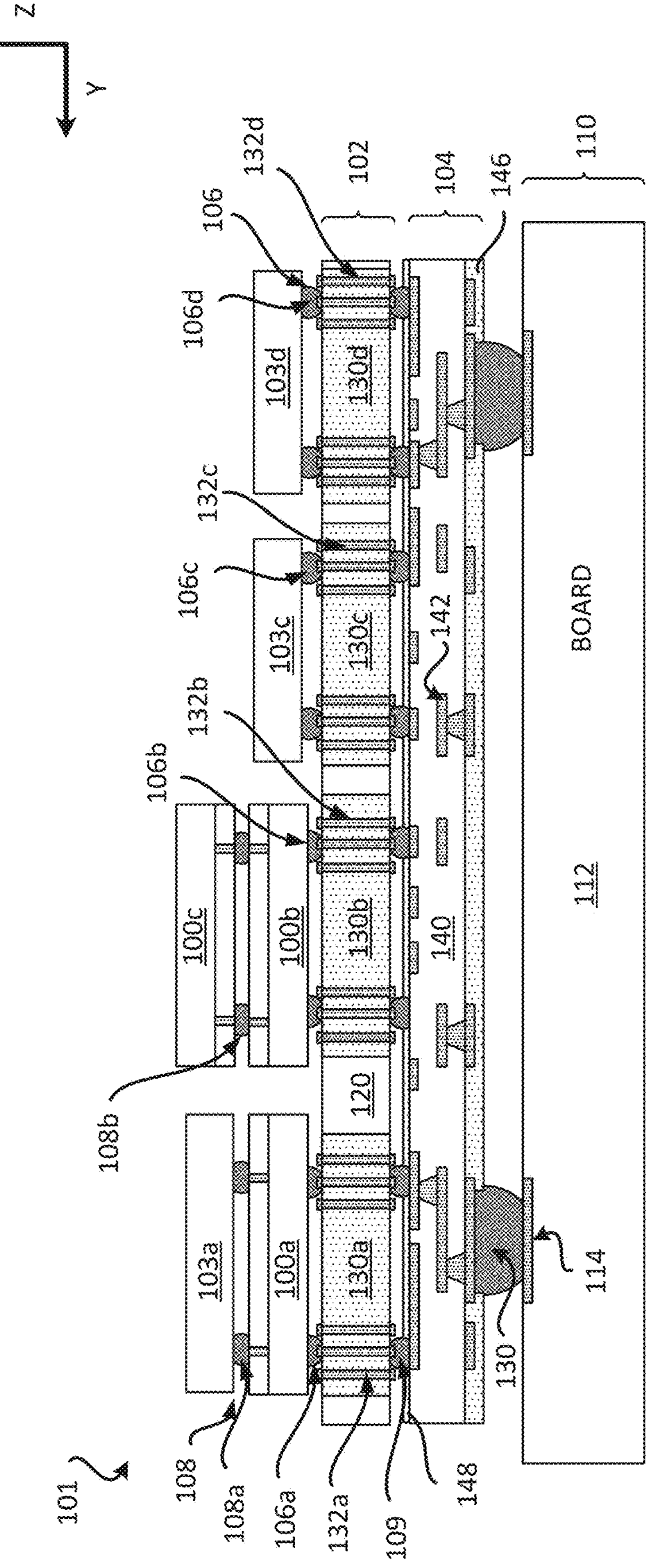
FIG. 1 illustrates a cross sectional profile view of an exemplary package that includes a substrate and an integrated device that includes a die substrate with a porous portion.

Exemplary Package Comprising Integrated Devices and an Interposer With a Porous Portion FIG. 1 illustrates a cross sectional profile view of a package 101 that includes an interposer with a porous portion. The package 101 includes an interposer 102, a substrate 104, an integrated device 100*a*, an integrated device 100*b*, an integrated device 100*c*, an integrated device 103*a*, an integrated device 103*c* and an integrated device 103*d*.

The substrate 104 may be a package substrate. The substrate 104 is coupled to the board 110 through a plurality of solder interconnects 130. The interposer 102 is coupled to the substrate 104 through a plurality of solder interconnects 109. The interposer 102 includes a silicon substrate 120 and a plurality of interconnects 132. The plurality of interconnects 132 may include a plurality of interposer interconnects. The plurality of interconnects 132 may include a plurality of vias (e.g., via interconnects) and/or pads (e.g., pad interconnects). The plurality of interconnects 132 may include a plurality of interconnects 132*a*, a plurality of interconnects 132*b*, a plurality of interconnects 132*c*, and a plurality of interconnects 132*d*.

The integrated device 100*a* is coupled to the interposer 102 through a plurality of solder interconnects 106*a*. The integrated device 100*b* is coupled to the interposer 102 through a plurality of solder interconnects 106*b*. The integrated device 103*c* is coupled to the interposer 102 through a plurality of solder interconnects 106*c*. The integrated device 103*d* is coupled to the interposer 102 through a plurality of solder interconnects 106*d*.

The integrated device 103*a* is coupled to the integrated device 100*a* through a plurality of solder interconnects 306*a*. For example, the front side of the integrated device 103*a* is coupled to the back side of the integrated device 100*a* through a plurality of solder interconnects 108*a*. The integrated device 100*c* is coupled to the integrated device 100*b* through a plurality of solder interconnects 108*b*. For example, the back side of the integrated device 100*c* is coupled to the back side of the integrated device 100*b* through a plurality of solder interconnects 108*b*. In such instances, the plurality of solder interconnects 108*b* may be coupled to the metallization interconnects of the integrated device 100*b* and the metallization interconnects of the integrated device 100*c*.

The interposer 102 includes the silicon substrate 120. The silicon substrate 120 includes a porous portion 130*a*, a porous portion 130*b*, a porous portion 130*c* and a porous portion 130*d*. The porous portion 130*a*, the porous portion 130*b*, the porous portion 130*c* and/or the porous portion 130*d* may be a portion of the silicon substrate 120 that has a different porosity, different density and/or different coefficient of thermal expansion from that of a bulk silicon substrate. The porous portion 130*a*, the porous portion 130*b*, the porous portion 130*c* and/or the porous portion 130*d* may be one or more local portions and/or localized portions of the silicon substrate 120. A porous portion of a material as used in the disclosure is a portion of the material that has been porosified using a porosification process.

A porosification process may be used to form the porous portion 130*a*, the porous portion 130*b*, the porous portion 130*c* and/or the porous portion 130*d*. As will be further described below, the porous portion 130*a*, the porous portion 130*b*, the porous portion 130*c* and/or the porous portion 130*d* allow more vias (e.g., via interconnects) to be formed in the silicon substrate 120, with minimal warpage issues due to mismatch in the coefficient of thermal expansions (CTEs) of the silicon substrate 120 and the plurality of interconnects 132. The plurality of interconnects 123 extend through the porous portion 130*a*, the porous portion 130*b*, the porous portion 130*c* and/or the porous portion 130*d* of the silicon substrate 120. However, in some implementations, a plurality of interconnects 132 may also extend through an unporosified portion of the silicon substrate 120.

At least some of the interconnects from the plurality of interconnects 132*a* may extend through the porous portion 130*a*. At least some of the interconnects from the plurality of interconnects 132*b* may extend through the porous portion 130*b*. At least some of the interconnects from the plurality of interconnects 132*c* may extend through the porous portion 130*c*. At least some of the interconnects from the plurality of interconnects 132*d* may extend through the porous portion 130*d*.

The unporosified portion of the silicon substrate 120 may have a coefficient of thermal expansion of about 2.6 parts per million per Celsius degree (ppm/C). When the plurality of interconnects 132 include copper (Cu), the plurality of interconnects 132 may have a coefficient of thermal expansion of about 17 parts per million per Celsius degree (ppm/C). The mismatch in the CTE of the silicon substrate 120 and the CTE of the plurality of interconnects 132 means that the area of the plurality of interconnects 132 cannot be greater than 1 percent of the area of the silicon substrate 120. Anything greater than 1 percent can lead to warpage issues in the interposer 102. To address the warpage issue and increase the ability of the silicon substrate 120 to have more plurality of interconnects 132, the silicon substrate 120 may be processes to include one or more porous portions and/or portions of the silicon substrate 120 to be more porous. Increasing the porosity of the entire silicon substrate 120 or portions of the silicon substrate 120, results in the porous portion to be less dense, relative to other parts of the silicon substrate 120 or the bulk silicon substrate. Increasing the porosity of a portion of the silicon substrate 120 may also increase the CTE of the porous portion of the silicon substrate 120, resulting in less mismatch between the CTE of the porous portion of the silicon substrate 120 and the CTE of the plurality of interconnects 132. A decrease in the mismatch of the CTE of the porous portion to the CTE of the plurality of interconnects 132 means that more interconnects 132 may be formed and extended in the silicon substrate 120. The number of interconnects 132 that may be formed in the porous portion of the silicon substrate 120 may depend on the porosity of the porous portion. A higher porosity may mean more through substrate vias may be formed in the porous portion relative to another porous portion with a lower porosity. In some implementations, one or more porous portions may have a porosity in a range of 30%-70%. Different porous portions may have different porosity.

In some implementations, a porosity of a material may be a measure of the void (e.g., empty spaces) in the material, and is a fraction of the volume of voids over the total volume, as a percentage between 0% and 100%. A porosity of a material may be quantified by the weight of the material measured before and after porosification. A higher level of porosity leads to a lower mass density. As an example, the density of a bulk silicon (Si) may be about 2.33 grams per cubic centimeter (g/cc). A silicon that has 30% porosity, may have a density of about 1.63 grams per cubic centimeter (g/cc). A silicon that has 20% porosity, may have a density of about 1.86 grams per cubic centimeter (g/cc). A silicon that has X %, may have a density of about $2.33*(100-X)/100$. In some implementations, a bulk silicon or a portion of a bulk silicon that has not been porosified, may be referred to as an unporosified silicon and/or an unporosified portion of silicon. Moreover, an unporosified silicon may be referred to as a bulk silicon. An unporosified silicon may have a density of about 2.33 grams per cubic centimeter (g/cc). In some implementations, a bulk silicon may be considered to have 0% porosity.

A porosification process may be used to form and/or define porous portions in the silicon substrate 120. In some implementations, a porosification process may include dipping a silicon wafer in an electrolyte of 1:1 mixture of hydrofluoric acid (HF) and ethanol. A current is then passed, using a platinum rod as cathode while the silicon wafer acts as anode. The substrate is then annealed at 300-400° C. to strengthen the microstructure. An HF-resistant etch-stop layer (e.g., silicon nitride) is used for selective (masked) porosification. However, different implementations may use a porosification process that includes different steps, other steps and/or other materials.

In some implementations, more than 1% (e.g., 1%-5%, at least 2%) of the surface area of the silicon substrate 120 may be occupied by a plurality of interconnects 132. In some implementations, a porous portion 130*a* of the silicon substrate 120 may have a first porosity, a porous portion 130*b* of the silicon substrate 120 may have a second porosity, a porous portion 130*c* of the silicon substrate 120 may have a third porosity, and a porous portion 130*d* of the silicon substrate 120 may have a fourth porosity, where the first porosity, the second porosity, the third porosity and/or the fourth porosity are different. In some implementations, the porous portion 130*a* may have a first CTE, the porous portion 130*b* may have a second CTE, the porous portion 130*c* may have a third CTE, and the porous portion 130*d* may have a fourth CTE, where the first CTE, the second CTE, the third CTE and the fourth CTE are different. In some implementations, the first CTE, the second CTE, the third CTE and the fourth CTE may be different from the CTE of the bulk (unporosified) silicon substrate 120.

In some implementations, the porosity of the porous portion may be dependent on the integrated device that will be coupled to interconnects located in the porous portion. For example, an integrated device that has high density interconnects may be configured to be electrically coupled to interconnects located in a relatively high porosity porous portion, due to the need to have high density interconnects. In another example, an integrated device that has relative low density interconnects may be configured to be electrically coupled to interconnects located in a relatively low porosity porous portion.

An electrical path to and/or from the integrated device 100*a* may include at least one solder interconnect from the plurality of solder interconnects 106*a*, and an interconnect from the plurality of interconnects 132*a*. An electrical path to and/or from the integrated device 100*b* may include at least one solder interconnect from the plurality of solder interconnects 106*b*, and an interconnect from the plurality of interconnects 132*b*.

An electrical path to and/or from the integrated device 103*c* may include at least one solder interconnect from the plurality of solder interconnects 106*c*, and an interconnect from the plurality of interconnects 132*c*. An electrical path to and/or from the integrated device 103*d* may include at least one solder interconnect from the plurality of solder interconnects 106*d*, and an interconnect from the plurality of interconnects 132*d*.

Figure 2:
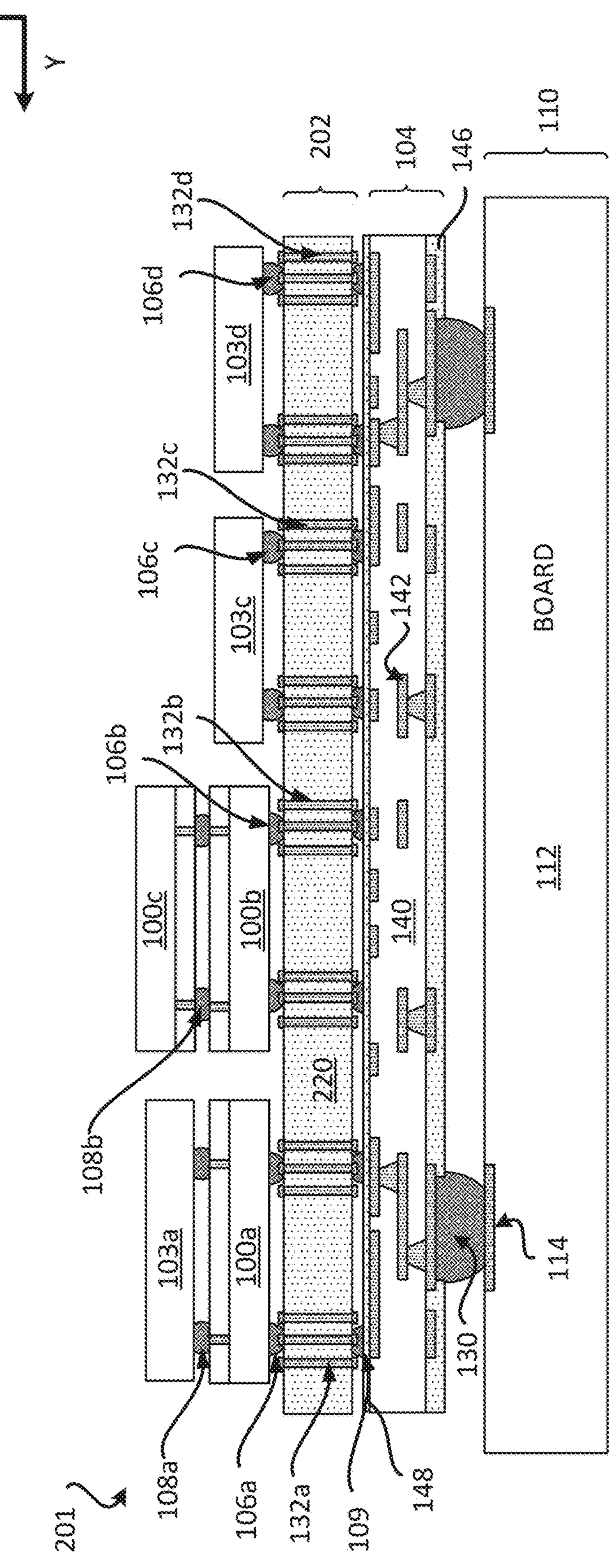
FIG. 2 illustrates a cross sectional profile view of an exemplary package that includes a substrate and an integrated device that includes a die substrate with a porous portion.

FIG. 1 illustrates an example of an interposer that includes localized porous portions. However, in some implementations, the entire interposer may include a porous portion. FIG. 2 illustrates a package 201 that includes an interposer that is entirely porous. The package 201 includes an interposer 202, a substrate 104, an integrated device 100*a*, an integrated device 100*b*, an integrated device 100*c*, an integrated device 103*a*, an integrated device 103*c* and an integrated device 103*d*. The package 201 is similar to the package 101, may be arranged and configured in a similar matter as the package 101. However, the interposer 202 includes a silicon substrate 220, where the entire silicon substrate 220 is porous. Thus, a porous portion may include the entire silicon substrate 220. In some implementations, the porosity of the silicon substrate 220 may be about the same for the entire silicon substrate 220. In some implementations, different portions of the silicon substrate 220 may have different porosities. In some implementations, the density of the silicon substrate 220 may be about the same for the entire silicon substrate 220. In some implementations, different portions of the silicon substrate 220 may have different densities. In some implementations, the CTE of the silicon substrate 220 may be about the same for the entire silicon substrate 220. In some implementations, different portions of the silicon substrate 220 may have different CTEs.

In some implementations, the porosity of the porous portion may be dependent on the integrated device that will be coupled to interconnects located in the porous portion. For example, an integrated device that has high density interconnects may be configured to be electrically coupled to interconnects located in a relatively high porosity porous portion, due to the need to have high density interconnects. In another example, an integrated device that has relative low density interconnects may be configured to be electrically coupled to interconnects located in a relatively low porosity porous portion, and/or interconnects located to an unporosified portion of the interposer.

Figure 3:
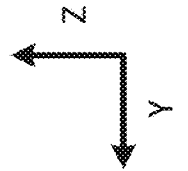
FIG. 3 illustrates a cross sectional profile view of an exemplary package comprising an integrated device and an interposer with a porous portion.
Figure 3:
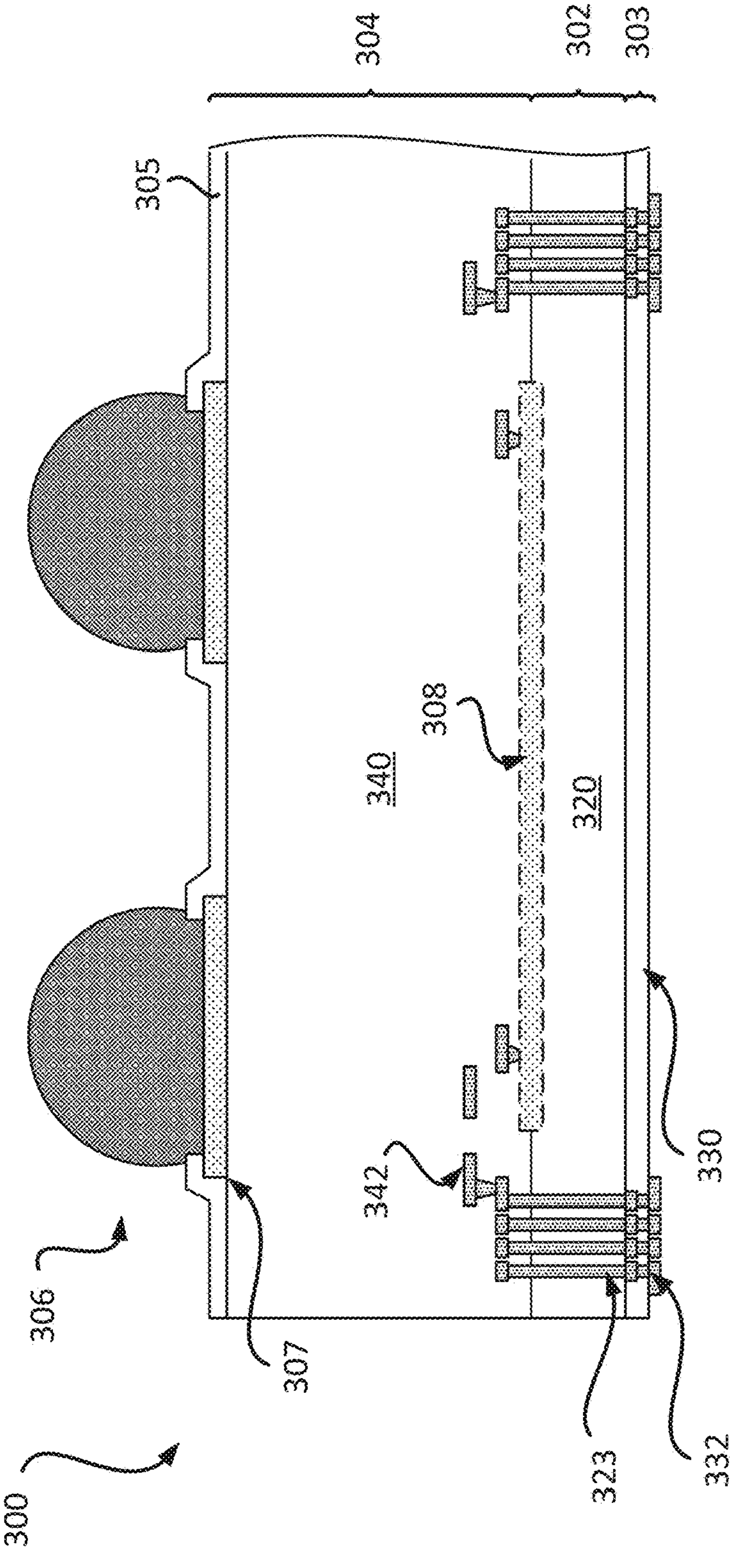

FIG. 3 illustrates a cross sectional profile view of an integrated device 300 that includes a die substrate with a porous portion. The integrated device 300 includes a die substrate portion 302, a metallization portion 303, and a die interconnection portion 304. The die substrate portion 302 includes a die substrate 320, an active region 308 and a plurality of through substrate vias 323. The active region 308 may include a plurality of logic cells, a plurality of transistors, and/or a plurality of filters. Different implementations may use different types of transistors, such as a field effect transistor (FET), planar FET, finFET, and a gate all around FET. In some implementations, a front end of line (FEOL) process may be used to fabricate the active region 308 of the die substrate 320. The die substrate 320 may include silicon. A plurality of through substrate vias 323 may extend through the die substrate 320. The metallization portion 303 includes at least one dielectric layer 330 and a plurality of metallization interconnects 332. The metallization portion 303 is coupled to the die substrate portion 302. The plurality of metallization interconnects 332 may be coupled to the plurality of through substrate vias 323. The metallization portion 303 may be a back side surface metallization portion. The plurality of metallization interconnects 332 may include a plurality of redistribution interconnects.

The die interconnection portion 304 includes at least one dielectric layer 340 and a plurality of die interconnects 342. The die interconnection portion 134 is coupled to the die substrate portion 302. The die substrate portion 302 is located between the metallization portion 303 and the die interconnection portion 304. The plurality of die interconnects 342 is coupled to the active region 308 of the die substrate portion 302. The die interconnection portion 304 may also include a plurality of pad interconnects 307 and a passivation layer 305. A plurality of solder interconnects 306 are coupled to the plurality of pad interconnects 307. In some implementations, a back end of line (BEOL) process may be used to fabricate the die interconnection portion 304.

In some implementations, an electrical path to and/or from an active region 308 may include at least one die interconnect from the plurality of die interconnects 342, at least one through substrate via from the plurality of through substrate vias 323 and at least one metallization interconnect from the plurality of metallization interconnects 333.

In some implementations, an electrical path to and/or from an active region 308 may include at least one die interconnect from the plurality of die interconnects 342, at least one pad interconnect from the plurality of pad interconnects 307 and at least one solder interconnect from the plurality of solder interconnects 306.

In some implementations, an electrical path between a solder interconnect from the plurality of solder interconnects 306 and a metallization interconnect from the plurality of metallization interconnects 332 may include at least one through substrate via from the plurality of through substrate vias 323 and at least one die interconnect from the plurality of die interconnects 342.

The integrated device 300 may represent any of the integrated devices described in the disclosure, such that the integrated device 100*a*, the integrated device 100*b*, the integrated device 100*c*, the integrated device 103*a*, the integrated device 103*c* and/or the integrated device 103*d*.

In some implementations, an integrated device may include a die substrate with at least one porous portion and/or one or more cavities.

Figure 4:
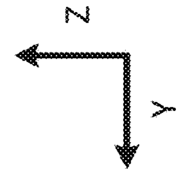
FIG. 4 illustrates a cross sectional profile view of an exemplary integrated device that includes a die substrate with a porous portion and a cavity.
Figure 4:
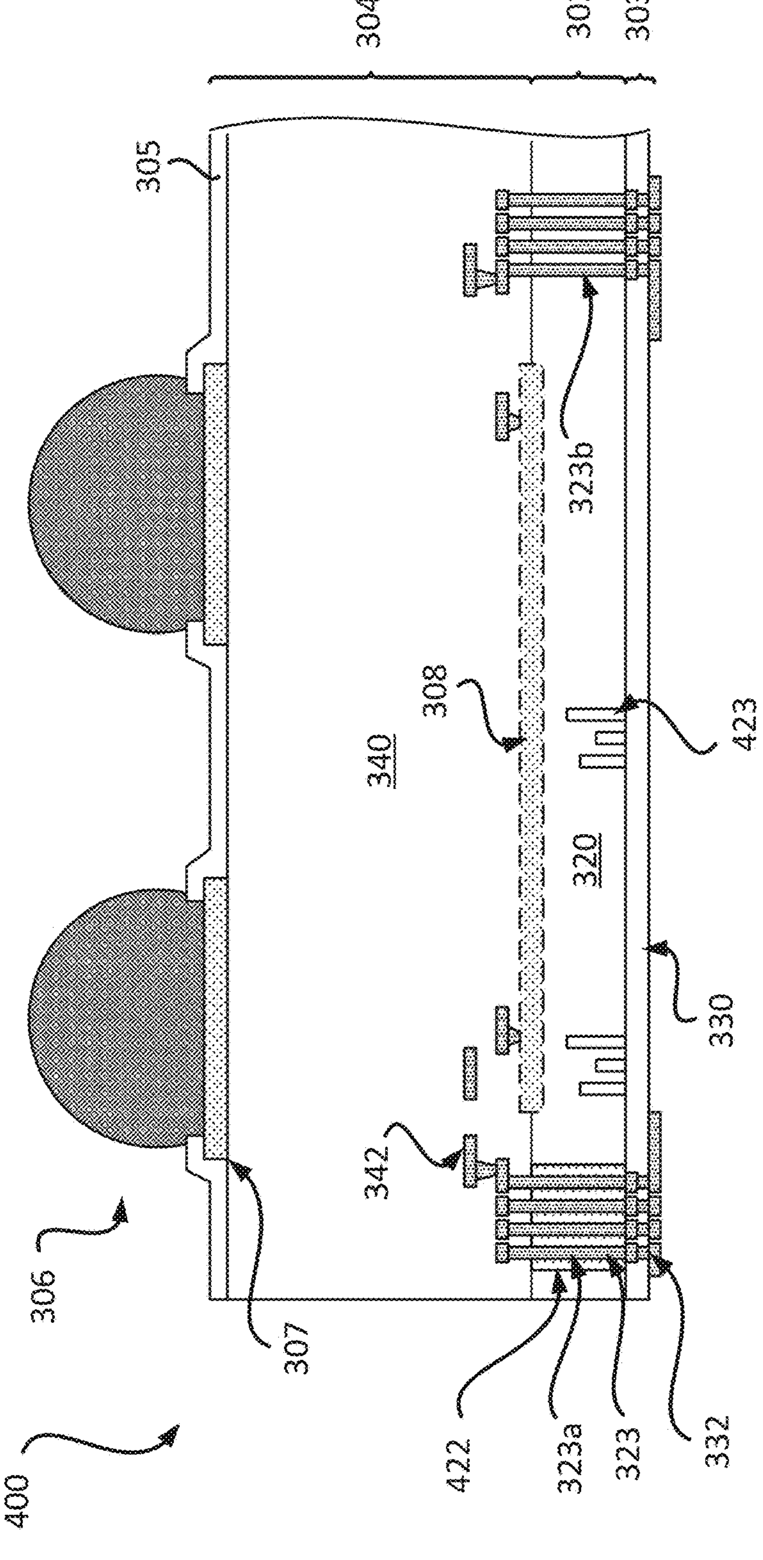

FIG. 4 illustrates a cross sectional profile view of an integrated device 400 that includes a die substrate with a porous portion and a cavity. The integrated device 400 is similar to the integrated device 300, and includes similar components as the integrated device 300. The integrated device 400 includes the die substrate portion 302, the metallization portion 303, and the die interconnection portion 304. The die substrate portion 302 includes the die substrate 320, the active region 308, a porous portion 422, a plurality of through substrate vias 323, and a plurality of cavities 423. The plurality of cavities 423 are located in the die substrate 320. The plurality of cavities 423 may be located in the porous portion 422. The plurality of cavities 423 may have different depths and/or may have the same depth. The porous portion 422 may be a porous portion (e.g., die substrate porous portion) of the die substrate 320.

The die substrate 320 may include silicon (Si). The die substrate 320 may include a porous portion 422. The die substrate 320 may comprise a bulk silicon that includes a porous portion 422. The porous portion 422 may be a portion of the die substrate 320 that has a different porosity, different density and/or different coefficient of thermal expansion from that of a bulk silicon. The porous portion 422 may be a local portion and/or localized portion of the die substrate 320. A porosification process may be used to form the porous portion 422. As will be further described below, the porous portion 422 allows more through substrate vias to be formed in the die substrate 320, with minimal warpage issues due to mismatch in the coefficient of thermal expansions (CTEs) of the die substrate 320 and the plurality of through substrate vias 323. The plurality of through substrate vias 323 extend through the porous portion 422 of the die substrate 320. However, in some implementations, a plurality of through substrate vias 323 may also extend through an unporosified portion of the die substrate 320. The plurality of through substrate vias 323 includes a first plurality of through substrate vias 323*a* and a second plurality of through substrate vias 323*b*. The first plurality of through substrate vias 323*a* extend through the porous portion 422 of the die substrate 320. The second plurality of through substrate vias 323*b* extend through an unporosified portion of the die substrate 320 (e.g., bulk portion of the die substrate 320). The term unporosified portion means that that a portion of the die substrate 320 has not undergone a porosification process that increases the porosity of the die substrate.

It is noted that the porous portion 422 may include several porous portions. Thus, a die substrate 320 may include a first porous portion, a second porous portion, a third porous portion and so on and so forth. Therefore, a die substrate 320 may include a plurality of porous portions. Each porous portion may include a plurality of through substrate vias that extend through that respective porous portion. The size of each porous portion may be different with different implementations.

When the die substrate portion 302 includes silicon, the unporosified portion of the die substrate 320 may have a coefficient of thermal expansion (CTE) of about 2.6 parts per million per Celsius degree (ppm/C). When the plurality of through substrate vias 323 include copper (Cu), the plurality of through substrate vias 323 may have a coefficient of thermal expansion (CTE) of about 17 parts per million per Celsius degree (ppm/C). The mismatch in the CTE of the die substrate 320 and the CTE of the plurality of through substrate vias 323 means that the area of the plurality of through substrate vias 323 cannot be greater than 1 percent of the area of the die substrate 320. Anything greater than 1 percent can lead to warpage issues in the integrated device 400. To address the warpage issue and increase the ability of the die substrate 320 to have more plurality of through substrate vias 323, the die substrate 320 may be processes to include one or more porous portions and/or portions of the die substrate 320 to be more porous. Increasing the porosity of the entire die substrate (e.g., 320) or portions of the die substrate 320, results in the porous portion to be less dense, relative to other parts of the die substrate 320 or the bulk die substrate. Increasing the porosity of a portion of the die substrate 320 may also increase the CTE of the porous portion of the die substrate 320, resulting in less mismatch between the CTE of the porous portion of the die substrate 320 and the CTE of the plurality of through substrate vias 323. A decrease in the mismatch of the CTE of the porous portion to the CTE of the plurality of through substrate vias 323 means that more through substrate vias 323 may be formed and extended in the die substrate 320. The number of through substrate vias 323 that may be formed in the porous portion of the die substrate 320 may depend on the porosity of the porous portion. A higher porosity may mean more through substrate vias may be formed in the porous portion relative to another porous portion with a lower porosity. In some implementations, one or more porous portions may have a porosity in a range of 30%-70%. Different porous portions may have different porosity.

Providing the plurality of cavities 423 in the die substrate 320 may effectively reduce the overall density of the die substrate 320 and increase the effective CTE of the die substrate 320. This in turn, helps reduce the CTE mismatch between the CTE of the die substrate 320 and the CTE of the plurality of through substrate vias 323. As such, more plurality of through substrate vias 323 may be formed and/or provided in the die substrate 320, enabling a higher number of interconnects in the integrated device 400. It is noted that forming the plurality of cavities 423 in the die substrate 320 is different from forming a porous portion in the die substrate 320.

The integrated device 400 may represent any of the integrated devices described in the disclosure, such that the integrated device 100*a*, the integrated device 100*b*, the integrated device 100*c*, the integrated device 103*a*, the integrated device 103*c* and/or the integrated device 103*d*. In some implementations, power to an integrated device may travel through the back side of the integrated device. For example, power for the integrated device 300 and/or the integrated device 400 may travel through an electrical path that includes the plurality of metallization interconnects 332, the plurality of through substrate vias 323 and/or the plurality of die interconnects 342. In some implementations, power for the integrated device 300 and/or the integrated device 400 may travel through an electrical path that includes the solder interconnect from the plurality of solder interconnects 306, a pad interconnect from the plurality of pad interconnects 307 and/or die interconnects from the plurality of die interconnects 342. A front side of an integrated device (e.g., 300, 400) may include the side that includes the plurality of pad interconnects 107. A back side of an integrated device (e.g., 300, 400) may include the side that includes the die substrate 320 and/or the metallization portion 303.

Figure 5:
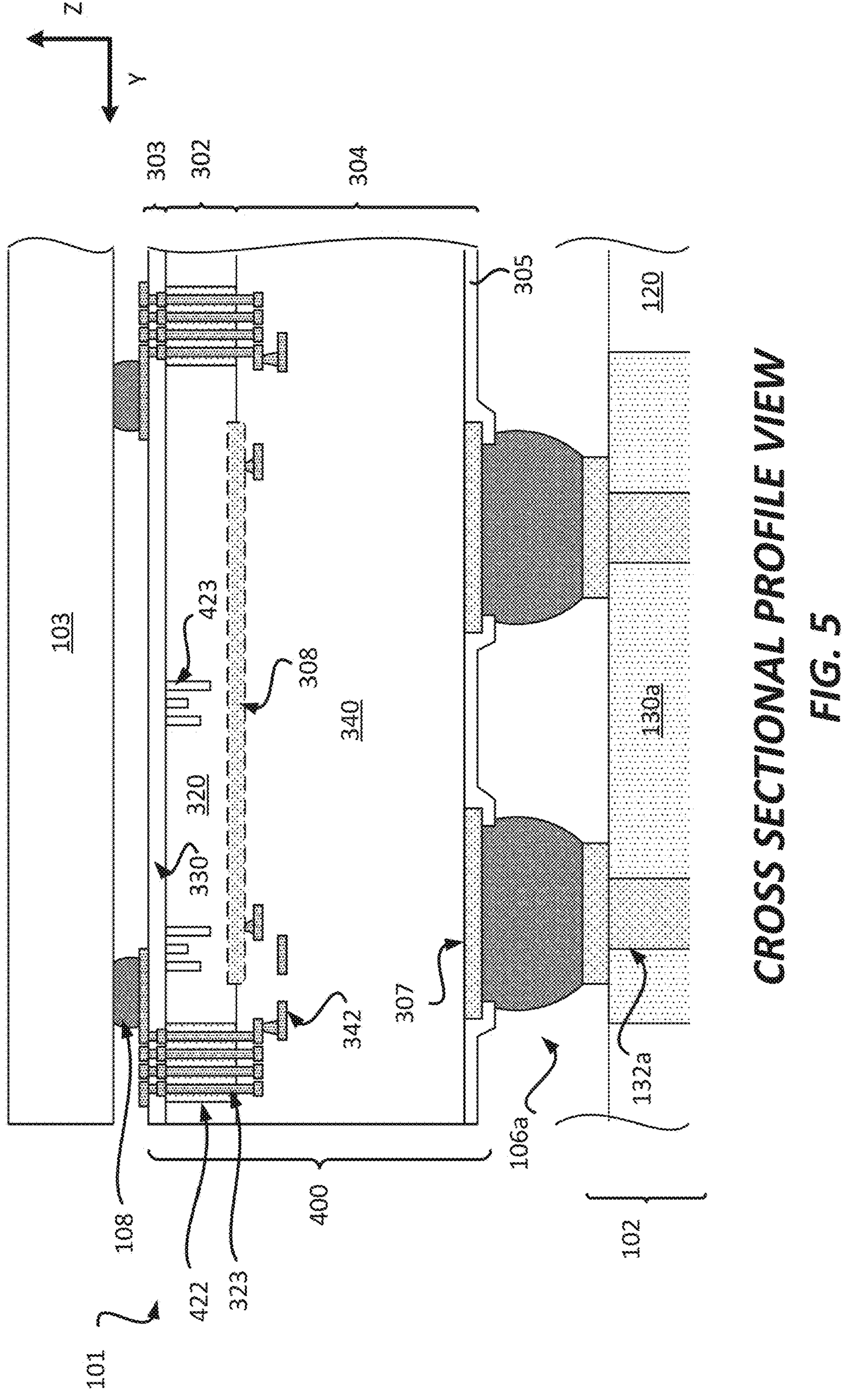
FIG. 5 illustrates a close-up view of an exemplary package that includes a substrate and an integrated device that includes a die substrate with a porous portion.

FIG. 5 illustrates a close up of the package 101 of FIG. 1. As shown in FIG. 5, a front side of the integrated device 103 is coupled to the back side of the integrated device 400 through the plurality of solder interconnects 108. The plurality of solder interconnects 108 may be coupled to pad interconnects of the integrated device 103 and metallization interconnects 432 from the metallization portion 303 of the integrated device 400. The integrated device 400 is coupled to the interposer 102 through a plurality of solder interconnects 106*a*. The plurality of solder interconnects 106*a* are coupled to and touching the plurality of pad interconnects 107 and the plurality of interconnects 132*a*.

An electrical path between the integrated device 103 and the integrated device 400 may include a pad interconnect from the plurality of pad interconnects of the integrated device 103, a solder interconnect from the plurality of solder interconnects 108, a metallization interconnect from the plurality of metallization interconnects 332 of the integrated device 400.

An integrated device (e.g., 300, 400) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device may include at least one electronic circuit (e.g., first electronic circuit, second electronic circuit, etc. . . . ). An integrated device may include an input/output (I/O) hub. An integrated device may include transistors. An integrated device may be an example of an electrical component and/or electrical device.

In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets and/or one of more of integrated devices (e.g., 100) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, a first integrated device and a second integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advanced technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Exemplary Sequence for Fabricating an Interposer Comprising a Porous Portion

Figure 6:
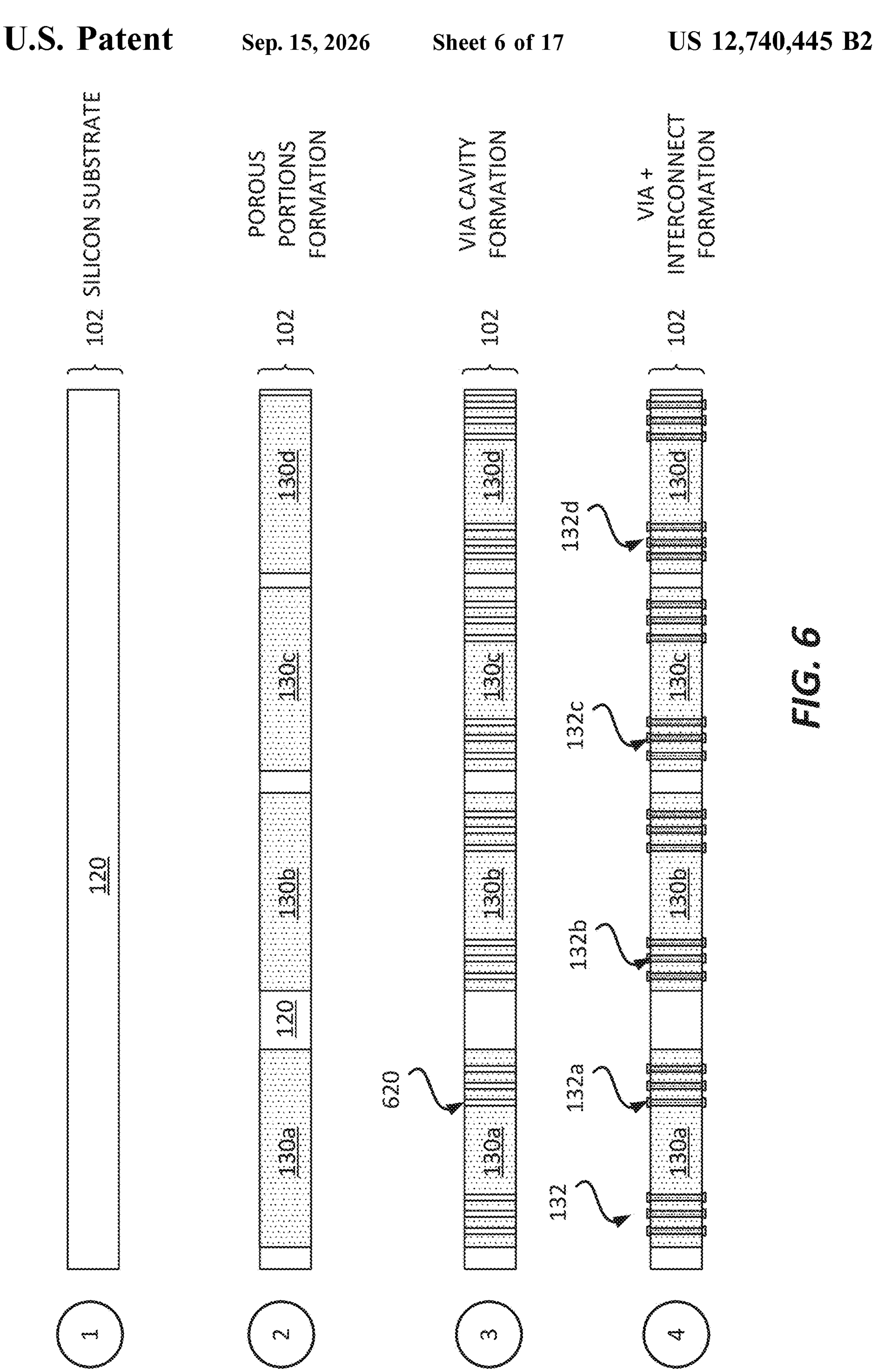
FIG. 6 illustrates an exemplary sequence for fabricating an interposer with at least one porous portion.

In some implementations, fabricating an interposer includes several processes. FIG. 6 illustrates an exemplary sequence for providing or fabricating an interposer. In some implementations, the sequence of FIG. 6 may be used to provide or fabricate the interposer 102. However, the process of FIG. 6 may be used to fabricate any of the interposer described in the disclosure.

It should be noted that the sequence of FIG. 6 may combine one or more stages in order to simplify and/or clarify the sequence for providing or fabricating an interposer. In some implementations, the order of the processes may be changed or modified. In some implementations, one or more of processes may be replaced or substituted without departing from the scope of the disclosure.

Stage 1, as shown in FIG. 6, illustrates a state after a silicon substrate 120 is provided. The silicon substrate 120 may be silicon block and/or silicon wafer.

Stage 2 illustrates a state after one or more porous portions are formed in the silicon substrate 120. A porosification process may be used to form and/or define porous portions in the silicon substrate 120. In some implementations, a porosification process may include dipping a silicon wafer in an electrolyte of 1:1 mixture of hydrofluoric acid (HF) and ethanol. A current is then passed, using a platinum rod as cathode while the silicon wafer acts as anode. The substrate is then annealed at 300-400° C. to strengthen the microstructure. An HF-resistant etch-stop layer (e.g., silicon nitride) is used for selective (masked) porosification. However, different implementations may use a porosification process that includes different steps, other steps and/or other materials. Stage 2 illustrates the porous portion 130*a*, the porous portion 130*b*, the porous portion 130*c* and the porous portion 130*d* are in the silicon substrate 120. The porous portion 130*a*, the porous portion 130*b*, the porous portion 130*c* and/or the porous portion 130*d* may be a portion of the silicon substrate 120 that has a different porosity, different density and/or different coefficient of thermal expansion from that of a bulk silicon substrate. In some implementations, the entire silicon substrate 120 is made porous.

Stage 3 illustrates a state after a plurality of via cavities 620 are formed in the silicon substrate 120. A laser ablation process may be used to form the plurality of via cavities 620. The plurality of via cavities 620 may be formed in the porous portion of the silicon substrate 120 and/or an unporosified portion of the silicon substrate 120.

Stage 4 illustrates a state after a plurality of interconnects 132 are formed in the plurality of cavities 620 and on surfaces of the silicon substrate 120. A plating process may be used to form the plurality of interconnects 732. Stage 4 may illustrate an interposer 102 that includes a silicon substrate 120, several porous portions (e.g., 130*a*, 130*b*, 130*c*, 130*d*) and a plurality of interconnects 132. The plurality of interconnects 132 may include a plurality of interconnects 132*a*, a plurality of interconnects 132*b*, a plurality of interconnects 132*c*, and a plurality of interconnects 132*d*. The plurality of interconnects 132*a* may extend through the porous portion 130*a*. The plurality of interconnects 132*b* may extend through the porous portion 130*b*. The plurality of interconnects 132*c* may extend through the porous portion 130*c*. The plurality of interconnects 132*d* may extend through the porous portion 130*d*. In some implementations, a plurality of interconnects may extend through an unporosified portion of the silicon substrate 120. Some interconnects from the plurality of interconnects 132*a*, the plurality of interconnects 132*b*, the plurality of interconnects 132*c*, and/or the plurality of interconnects 132*d* may be located and/or coupled to one or more surfaces of the silicon substrate 120 of the interposer 102. The plurality of interconnects 132 may include via interconnects, pad interconnects and/or trace interconnects.

Figure 7:
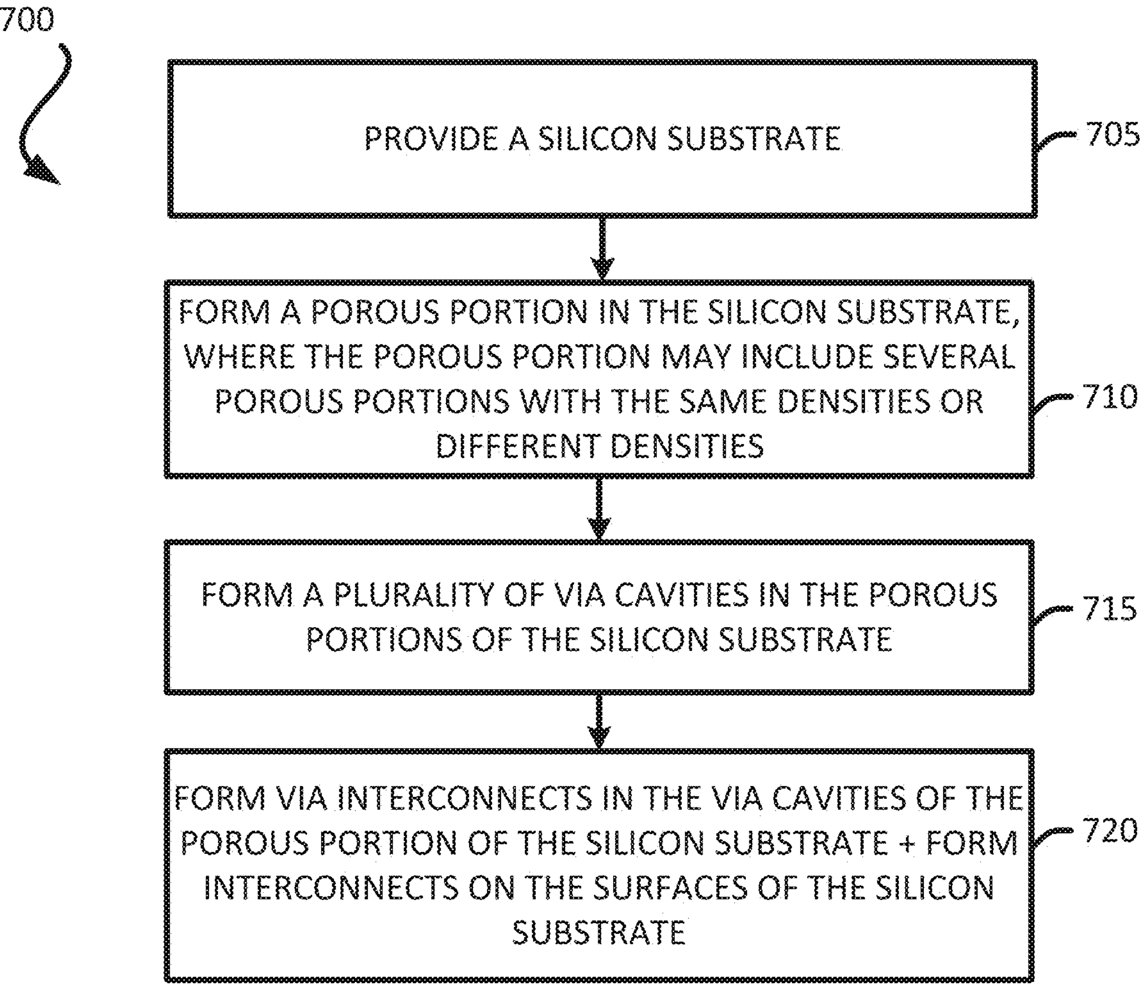
FIG. 7 illustrates an exemplary flow diagram of a method for fabricating an interposer with at least one porous portion.

Exemplary Flow Diagram of a Method for Fabricating an Interposer With a Porous Portion In some implementations, fabricating an interposer includes several processes. FIG. 7 illustrates an exemplary flow diagram of a method 700 for providing or fabricating an interposer. In some implementations, the method 700 of FIG. 7 may be used to provide or fabricate integrated device (e.g., 100*a*, 103*a*) of FIG. 1 described in the disclosure. However, the method 700 may be used to provide or fabricate any of the interposer described in the disclosure.

It should be noted that the method of FIG. 7 may combine one or more processes in order to simplify and/or clarify the method for providing or fabricating an interposer. In some implementations, the order of the processes may be changed or modified.

The method provides (at 705) a silicon substrate. Stage 1 of FIG. 6, illustrates and describes an example of a state after a silicon substrate 120 is provided. The silicon substrate 120 may be silicon block and/or silicon wafer.

The method forms (at 710) one or more porous portions in the silicon substrate. Stage 2 of FIG. 6, illustrates and describes an example of a state after one or more porous portions are formed in the silicon substrate 120. A porosification process may be used to form and/or define porous portions in the silicon substrate 120. In some implementations, a porosification process may include dipping a silicon wafer in an electrolyte of 1:1 mixture of hydrofluoric acid (HF) and ethanol. A current is then passed, using a platinum rod as cathode while the silicon wafer acts as anode. The substrate is then annealed at 300-400° C. to strengthen the microstructure. An HF-resistant etch-stop layer (e.g., silicon nitride) is used for selective (masked) porosification. However, different implementations may use a porosification process that includes different steps, other steps and/or other materials. Stage 2 illustrates the porous portion 130*a*, the porous portion 130*b*, the porous portion 130*c* and the porous portion 130*d* are in the silicon substrate 120. The porous portion 130*a*, the porous portion 130*b*, the porous portion 130*c* and/or the porous portion 130*d* may be a portion of the silicon substrate 120 that has a different porosity, different density and/or different coefficient of thermal expansion from that of a bulk silicon substrate. In some implementations, the entire silicon substrate 120 is made porous.

The method forms (at 715) via cavities in the silicon substrate. Stage 3 of FIG. 6, illustrates and describes an example of a state after a plurality of via cavities 620 are formed in the silicon substrate 120. A laser ablation process may be used to form the plurality of via cavities 620. The plurality of via cavities 620 may be formed in the porous portion of the silicon substrate 120 and/or an unporosified portion of the silicon substrate 120.

The method forms (at 720) vias (e.g., via interconnects) in and interconnects (e.g., pad interconnects) on the silicon substrate. Stage 4 of FIG. 6, illustrates and describes an example of a state after a plurality of interconnects 132 (e.g., via interconnects, pad interconnects) are formed in the plurality of cavities 620 and on surfaces of the silicon substrate 120. A plating process may be used to form the plurality of interconnects 732. Stage 4 may illustrate an interposer 102 that includes a silicon substrate 120, several porous portions (e.g., 130*a*, 130*b*, 130*c*, 130*d*) and a plurality of interconnects 132. The plurality of interconnects 132 may include a plurality of interconnects 132*a*, a plurality of interconnects 132*b*, a plurality of interconnects 132*c*, and a plurality of interconnects 132*d*. The plurality of interconnects 132*a* may extend through the porous portion 130*a*. The plurality of interconnects 132*b* may extend through the porous portion 130*b*. The plurality of interconnects 132*c* may extend through the porous portion 130*c*. The plurality of interconnects 132*d* may extend through the porous portion 130*d*. In some implementations, a plurality of interconnects may extend through an unporosified portion of the silicon substrate 120. Some interconnects from the plurality of interconnects 132*a*, the plurality of interconnects 132*b*, the plurality of interconnects 132*c*, and/or the plurality of interconnects 132*d* may be located and/or coupled to one or more surfaces of the silicon substrate 120 of the interposer 102.

Figure 8A:
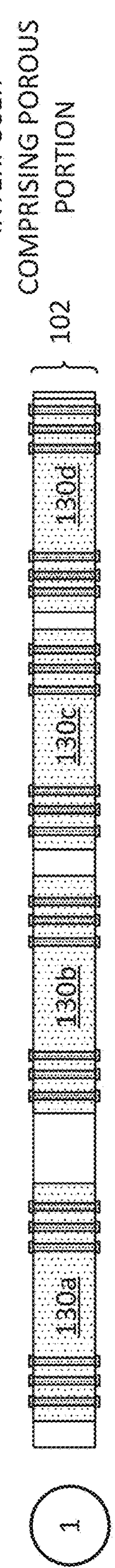
FIGS. 8A-8B illustrate an exemplary sequence for fabricating a package that includes an interposer with at least one porous portion and a plurality of integrated devices.
Figure 8A:
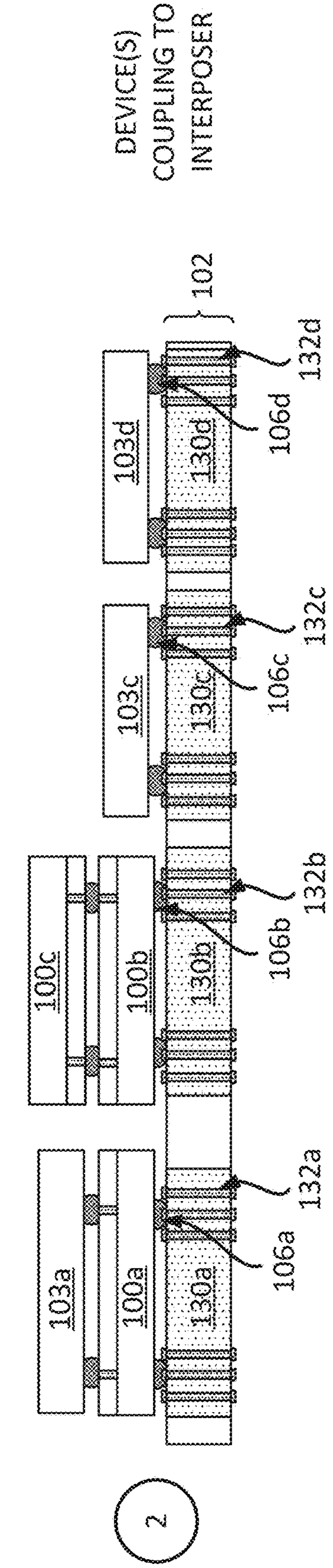
Figure 8B:
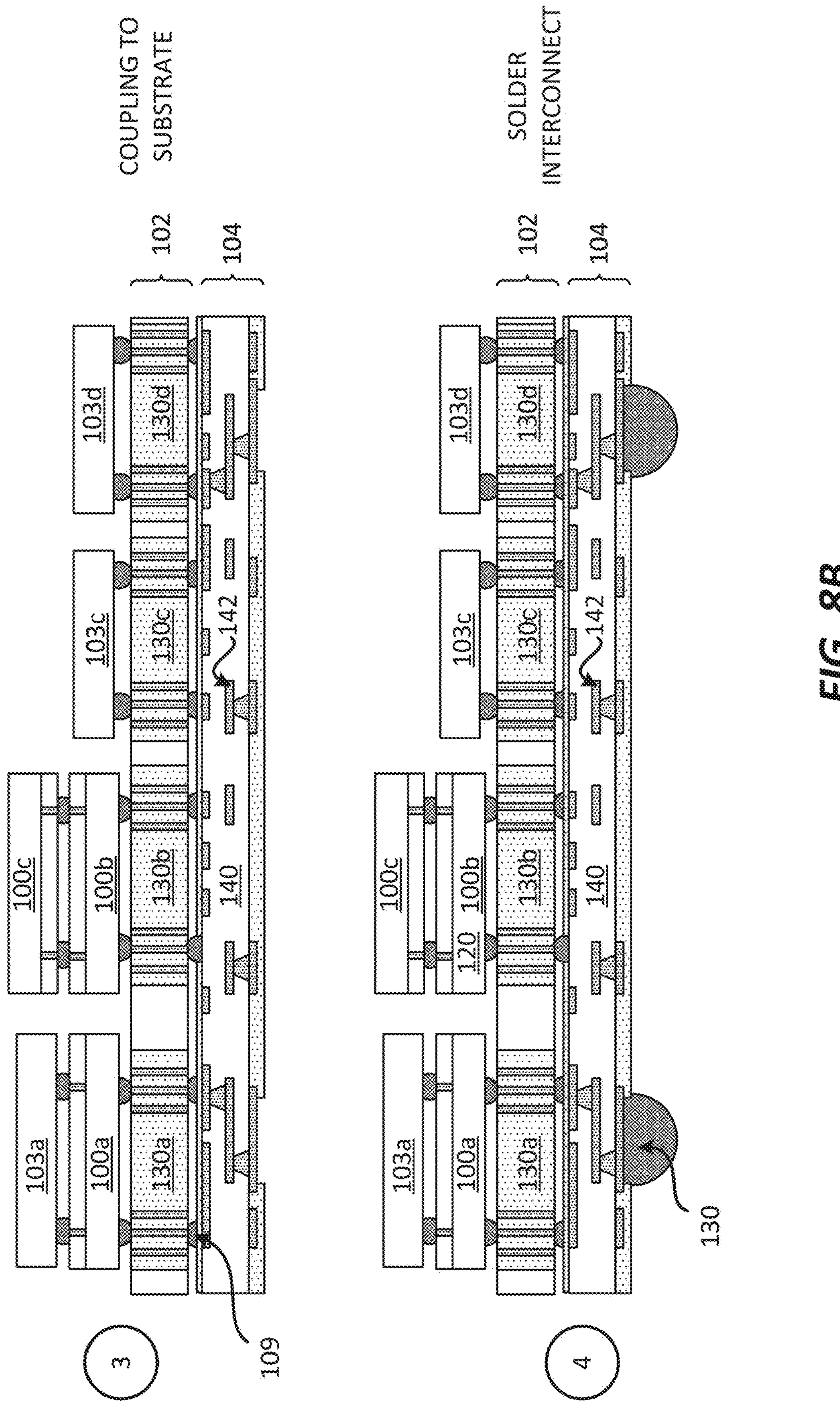

Exemplary Sequence for Fabricating a Package Comprising Integrated Devices and an Interposer with a Porous Portion In some implementations, fabricating a package includes several processes. FIGS. 8A-8B illustrate an exemplary sequence for providing or fabricating a package that includes an interposer and an integrated. In some implementations, the sequence of FIGS. 8A-8B may be used to provide or fabricate the package 101. However, the process of FIGS. 8A-8B may be used to fabricate any of the packages described in the disclosure.

It should be noted that the sequence of FIGS. 8A-8B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 8A, illustrates a state after an interposer 102 is provided. The interposer 102 may include a silicon substrate 120, several porous portions (e.g., 130*a*, 130*b*, 130*c*, 130*d*) and a plurality of interconnects 132.

Stage 2 illustrates a state after a plurality of integrated devices are coupled to the interposer 102. A plurality of solder interconnects (e.g., 106*a*, 106*b*, 106*c*, 106*d*) may be used to couple the integrated devices (e.g., 100*a*, 100*b*, 103*c*, 103*d*) to the plurality of interconnects 132 of the interposer 102. A solder reflow process may be used to form and couple the integrated devices to the plurality of interconnects 132 of the interposer 102.

Stage 3, as shown in FIG. 8B, illustrates a state after the interposer 102 is coupled to the substrate 104 through a plurality of solder interconnects 109. A solder reflow process may be used to form and couple the plurality of solder interconnects 109 to (i) the plurality of interconnects 142 of the substrate 104 and (ii) the plurality of interconnects 132 of the interposer 102.

Stage 4 illustrates a state after a plurality of solder interconnects 130 are coupled to the substrate 104. A solder reflow process may be used to couple the plurality of solder interconnects 130 are coupled to the plurality of interconnects 142 of the substrate 104.

Exemplary Sequence for Fabricating an Integrated Device Comprising a Die Substrate With a Porous Portion In some implementations, fabricating an integrated device includes several processes. FIGS. 9A-9F illustrate an exemplary sequence for providing or fabricating an integrated device comprising a die substrate with a porous portion and a cavity. In some implementations, the sequence of FIGS. 9A-9F may be used to provide or fabricate the integrated device 400. However, the process of FIGS. 9A-9F may be used to fabricate any of the integrated devices described in the disclosure.

It should be noted that the sequence of FIGS. 9A-9F may combine one or more stages in order to simplify and/or clarify the sequence for providing or fabricating an integrated device. In some implementations, the order of the processes may be changed or modified. In some implementations, one or more of processes may be replaced or substituted without departing from the scope of the disclosure.

Figure 9A:
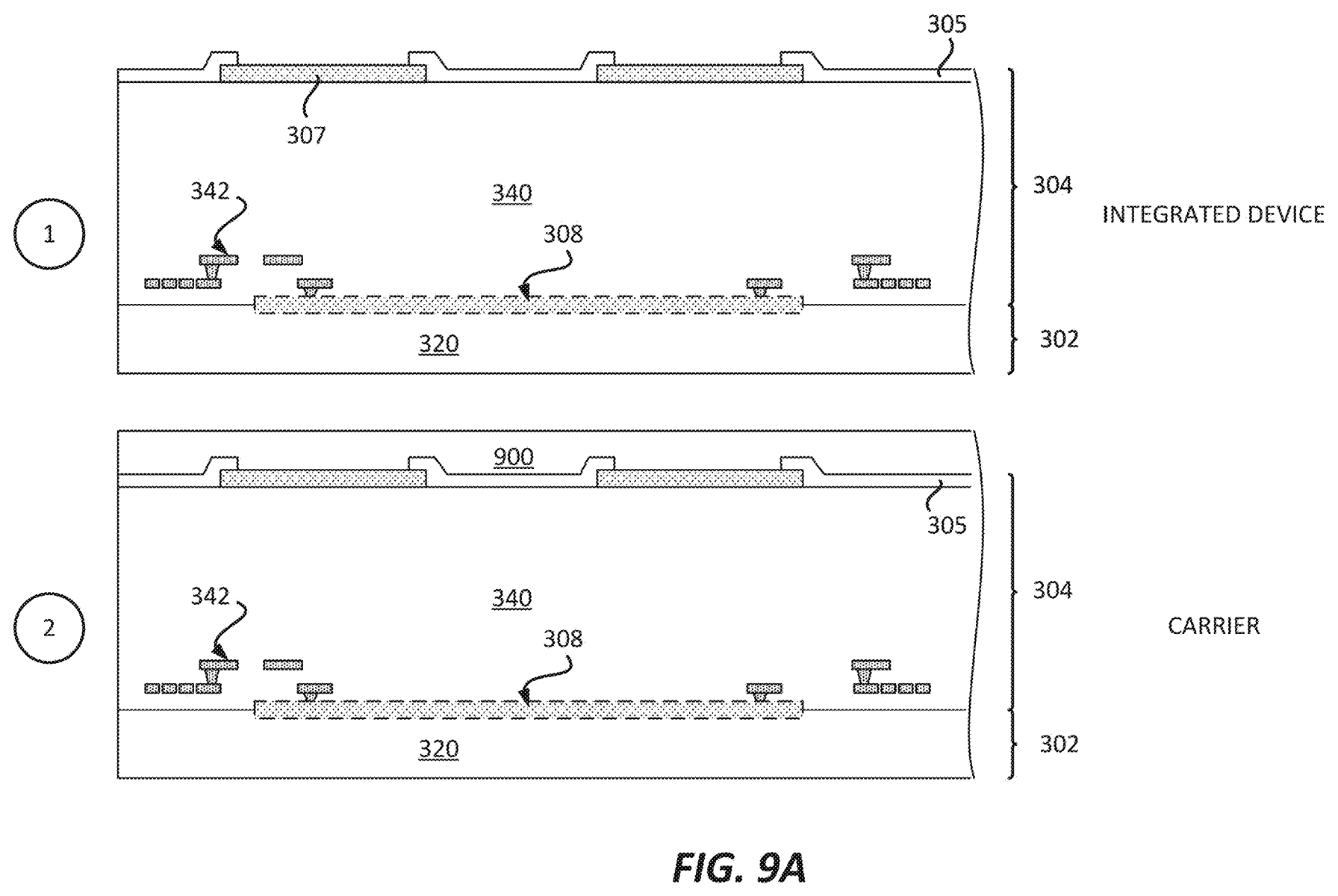

Stage 1, as shown in FIG. 9A, illustrates a state after an integrated device is provided and/or fabricated. The integrated device 400 may include a die substrate portion 302 and a die interconnection portion 304. The die substrate portion 302 includes a die substrate 320 and an active region 308. The die interconnection portion 304 includes at least one dielectric layer 340, a plurality of die interconnects 342, a plurality of pad interconnects 307 and a passivation layer 305. In some implementations, a front side of the integrated device 400 may include the side that includes the passivation layer 305 and/or the plurality of pad interconnects 307. In some implementations, a back side of the integrated device 400 may include the side that includes the die substrate 320.

Stage 2 illustrates a state after the integrated device 400 is coupled to a carrier 900. The carrier 900 may be a tape. The carrier may include an adhesive. The front side of the integrated device 400 may be coupled to and touching the carrier 900. For example the passivation layer 305 and/or the plurality of pad interconnects 307 may be coupled to and touch the carrier 900.

Figure 9B:
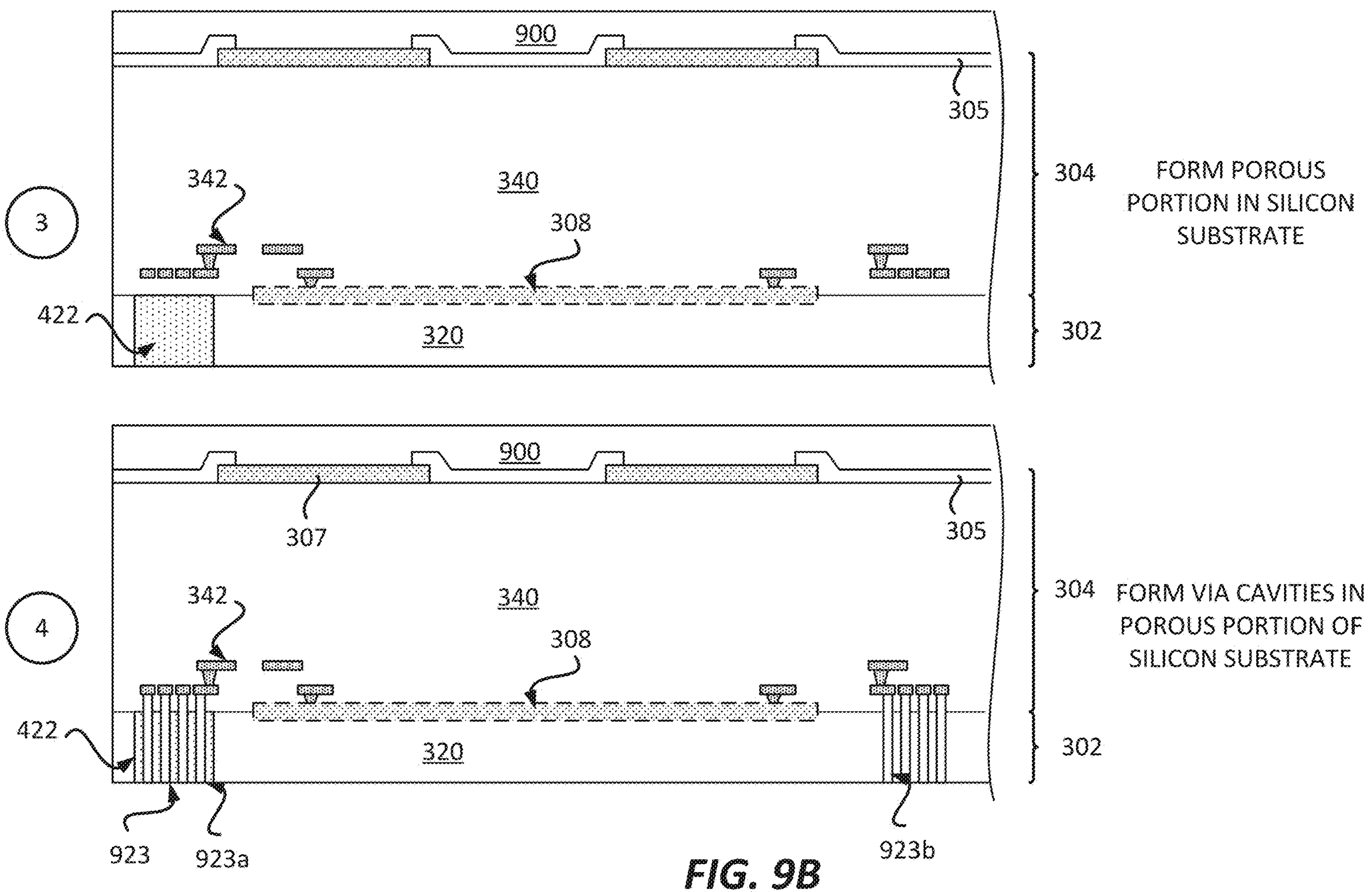

Stage 3, as shown in FIG. 9B, illustrates a state after a porous portion 422 is formed in the die substrate 320. In some implementations, more than one porous portion may be formed. The porous portion 422 may have a lower density than other portions of the die substrate 320. The die substrate 320 may include silicon. In some implementations, more than one porous portion may be formed in the die substrate 320. In some implementations, the porous portion may have different thicknesses.

A porosification process may be used to form and/or define porous portions in the die substrate 320. In some implementations, a porosification process may include dipping a silicon wafer in an electrolyte of 1:1 mixture of hydrofluoric acid (HF) and ethanol. A current is then passed, using a platinum rod as cathode while the silicon wafer acts as anode. The substrate is then annealed at 300-400° C. to strengthen the microstructure. An HF-resistant etch-stop layer (e.g., silicon nitride) is used for selective (masked) porosification. However, different implementations may use a porosification process that includes different steps, other steps and/or other materials.

Different porous portions may have the same porosity or different porosity. As a result of the porosification process, the porous portion may have different coefficients of thermal expansions (e.g., different from other porous portions, different from unporosified portions of the die substrate 320). The porosification process may change the density of the porous portion. In some implementations, one or more porous portions 422 may have a porosity in a range of about 30%-70%.

Stage 4 illustrates a state after a plurality of via cavities 923 are formed in the die substrate 320. The plurality of via of cavities 923 may include a first plurality via of cavities 923*a* and a second plurality of via cavities 923*b*. The first plurality of via cavities 923*a* may be formed through the porous portion 422 of the die substrate 320. The second plurality of via cavities 923*b* may be formed through the bulk portion of the die substrate 320 (e.g., unporosified portion of the die substrate 320). A laser process (e.g., laser ablation) may be used to form the plurality of via cavities 923. In some implementations, the plurality of via cavities 923 may extend into the die interconnection portion 304.

Figure 9C:
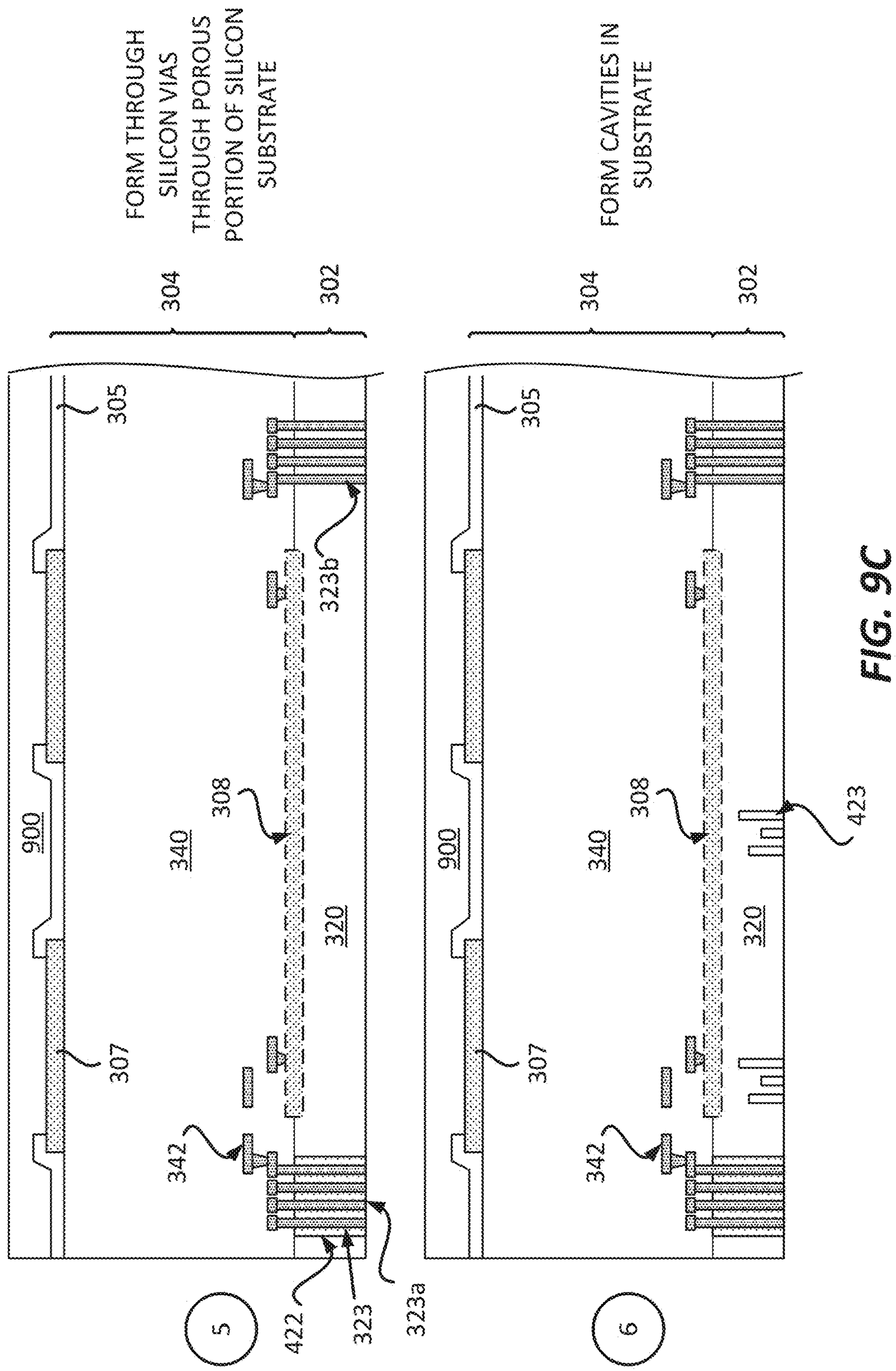

Stage 5, as shown in FIG. 9C, illustrates a state after a plurality of through substrate vias 323 are formed. A plating process may be used to form the plurality of substrate vias 323. The plurality of through substrate vias 323 may include a first plurality of through substrate vias 323*a* and a second plurality of through substrate vias 323*b*. The first plurality of through substrate vias 323*a* may be formed in the first plurality of via cavities 923*a*. The first plurality of through substrate vias 323*a* may extend through the porous portion 422 of the die substrate 320. The second plurality of through substrate vias 323*b* may be formed in the second plurality of via cavities 923*b*. The second plurality of through substrate vias 323*b* may extend through an unporosified portion of the die substrate 320. In some implementations, the plurality of through substrate vias 323 may extend into the die interconnection portion 304. The plurality of through substrate vias 323 may be coupled to the plurality of die interconnects 342.

Stage 6, illustrates a state after a plurality of cavities 423 are formed in the die substrate 320. A laser process (e.g., laser ablation) may be used to form the plurality of cavities 423. The plurality of cavities 423 may have the same depth or different depths. The plurality of cavities 423 may extend through the porous portion 422 and/or the unporosified portion of the die substrate 320.

Figure 9D:
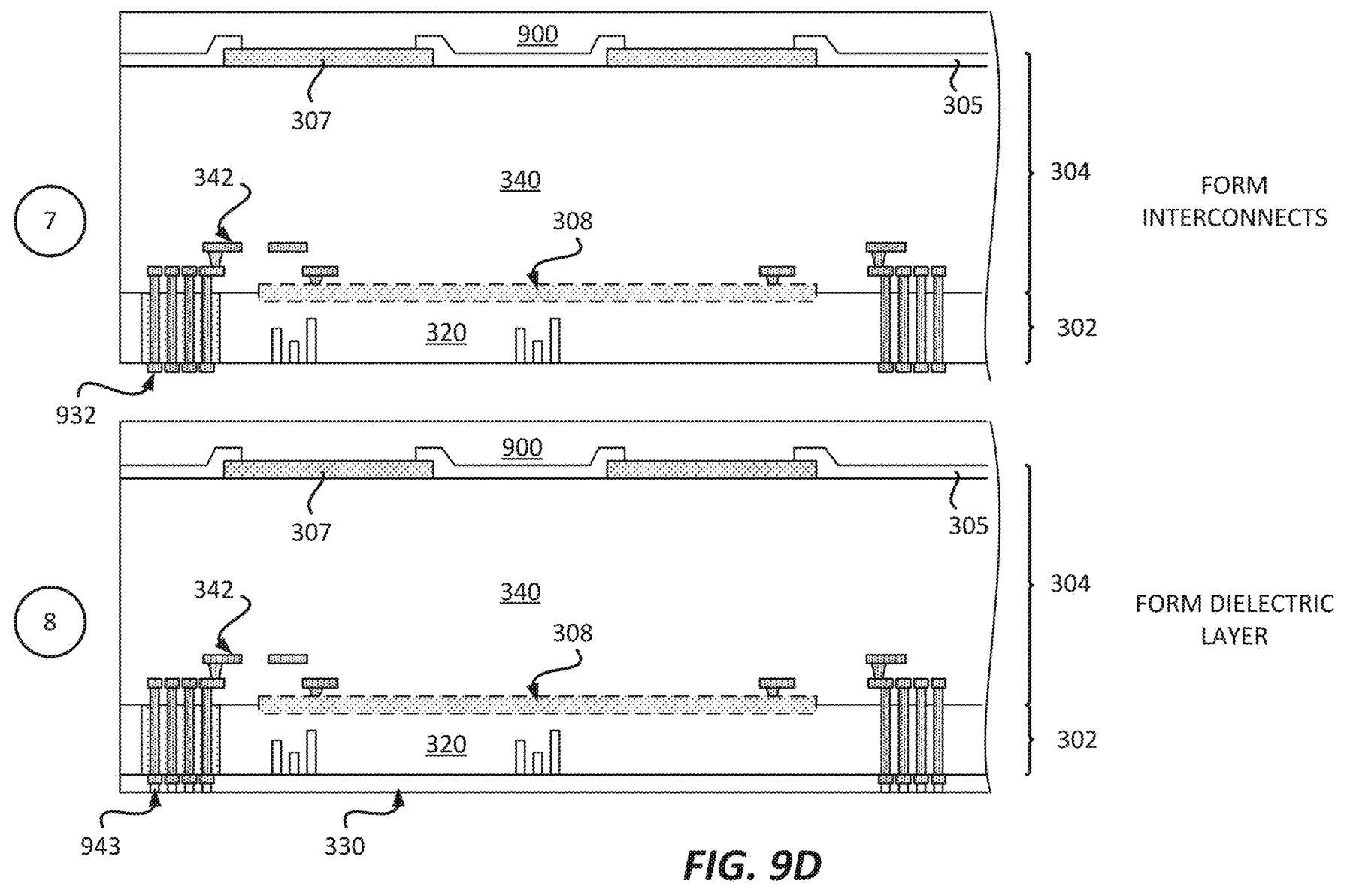

Stage 7, as shown in FIG. 9D, illustrates a state after a plurality of metallization interconnects 932 are formed on the back side surface of the die substrate 320. A plating process may be used to form the plurality of metallization interconnects 932. The plurality of metallization interconnects 932 may be coupled to the plurality of through substrate vias 323.

Stage 8, illustrates a state after a dielectric layer 330 is formed and coupled to the back side surface of the die substrate 320. The dielectric layer 330 may include a plurality of cavities 943. The dielectric layer 330 and the plurality of cavities 941 may be formed and/or provided using a deposition process, a lamination process, an exposure process and/or a development process.

Figure 9E:
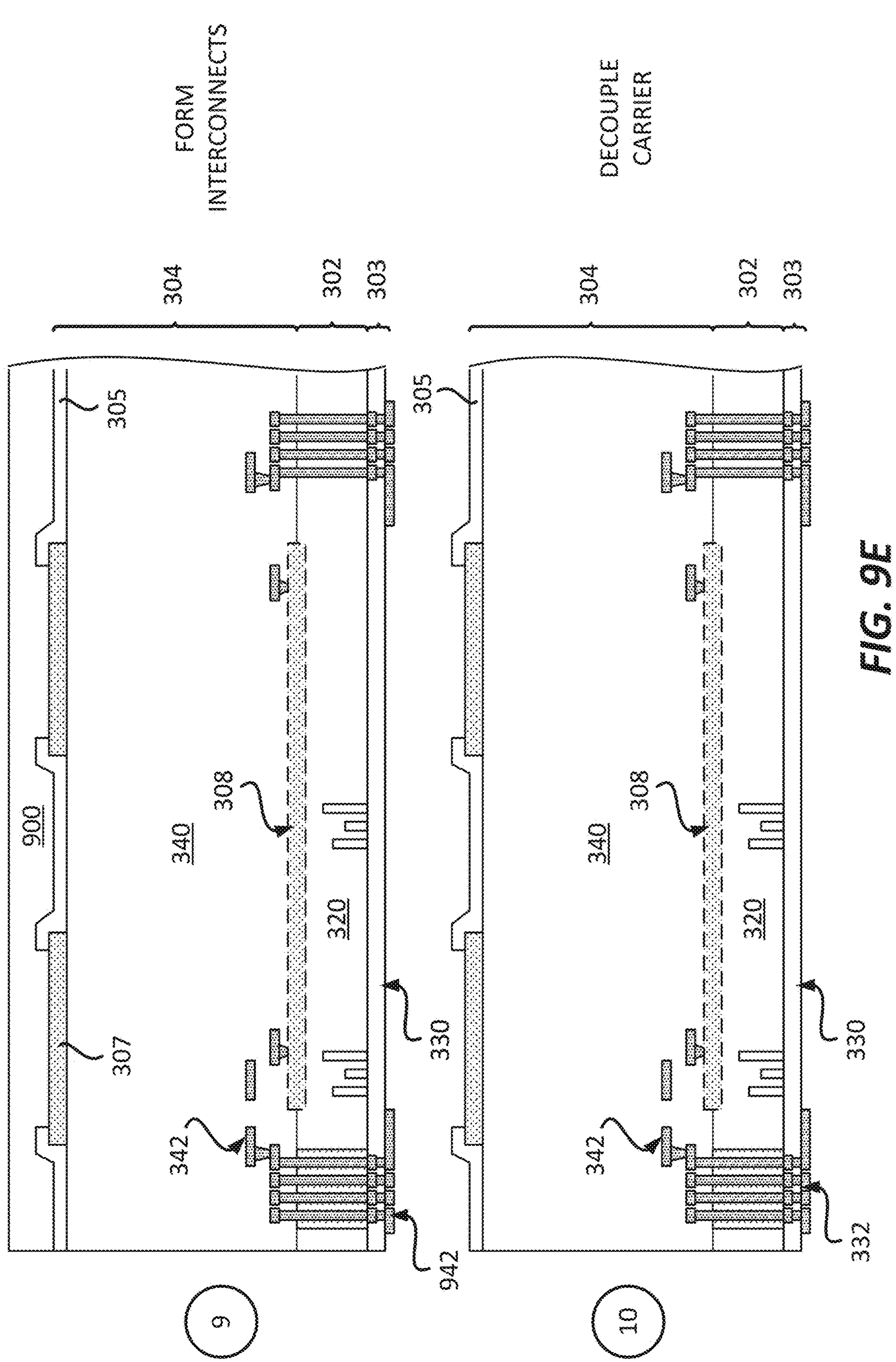

Stage 9, as shown in FIG. 9E, illustrates a state after a plurality of metallization interconnects 942 are formed. The plurality of metallization interconnects 942 may be coupled to the plurality of metallization interconnects 932. A plating process may be used to form the plurality of metallization interconnects 934. The plurality of metallization interconnects 932 and/or the plurality of metallization interconnects 942 may be represented as the plurality of metallization interconnects 332.

Stage 10 illustrates a state after the carrier 900 is decoupled from the integrated device 400. The carrier 900 may be detached and/or peeled off from the integrated device 400.

Figure 9F:
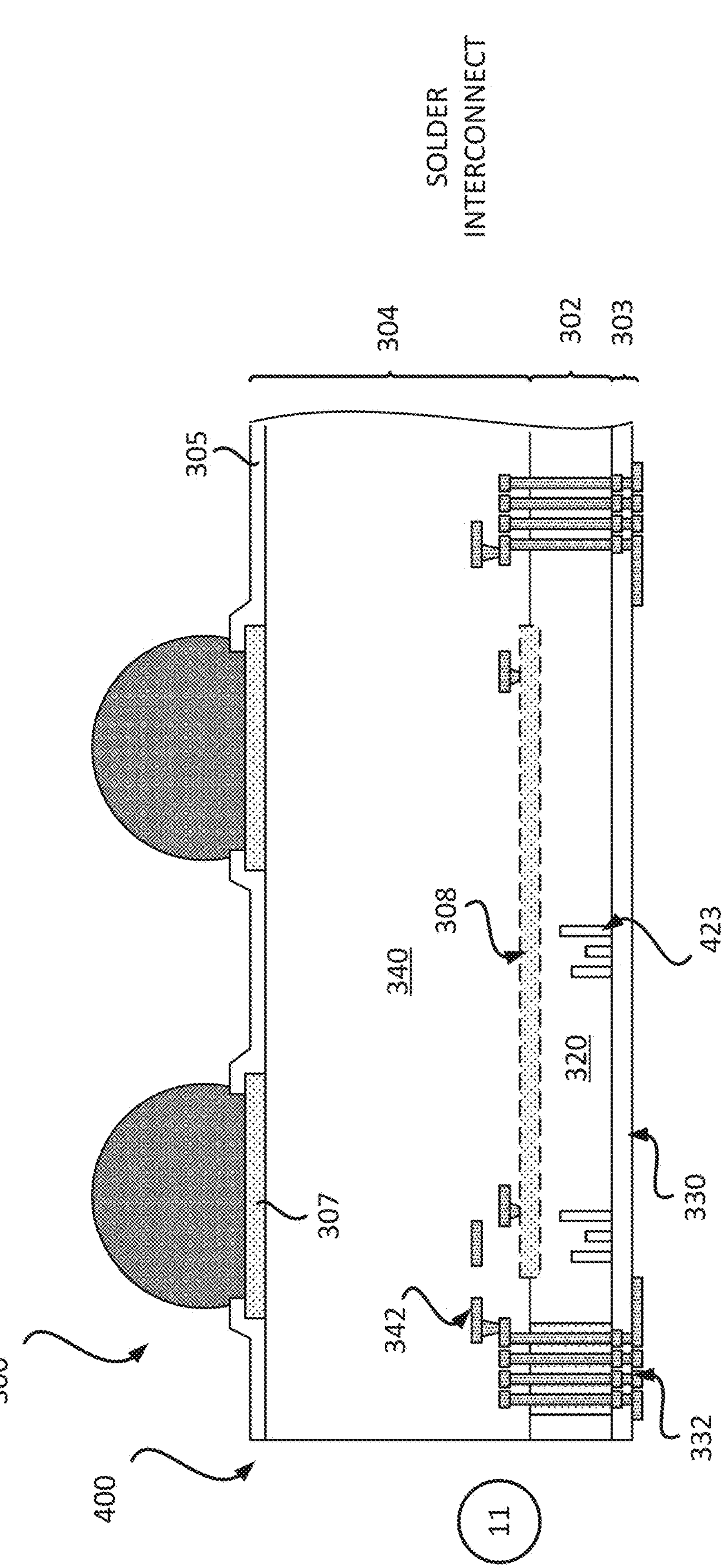

Stage 11, as shown in FIG. 9F, illustrates a state after the plurality of solder interconnects 306 are coupled to the plurality of pad interconnects 307. A solder reflow process may be used to form and couple the plurality of solder interconnects 306 to the plurality of pad interconnects 307.

Figure 10:
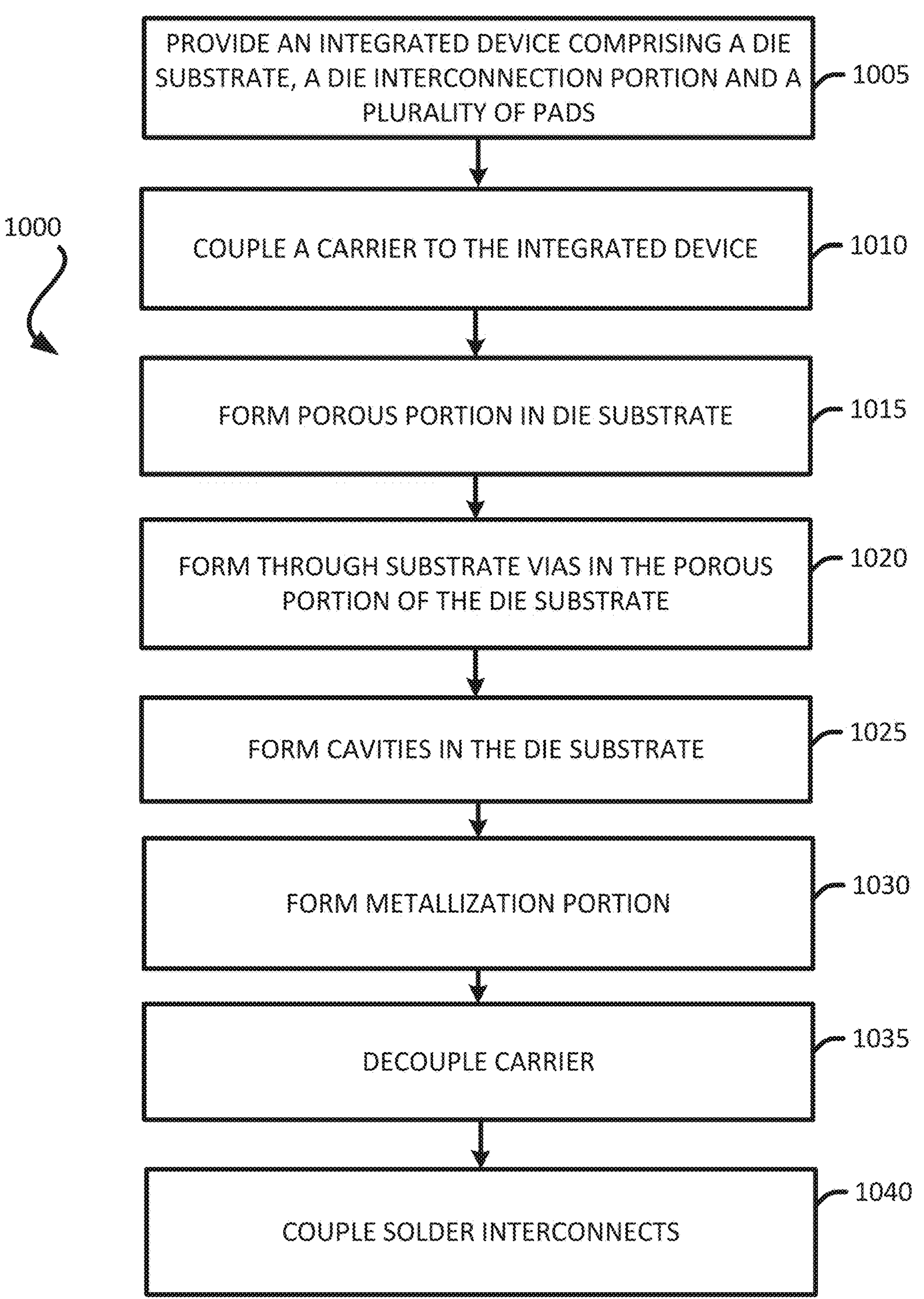
FIG. 10 illustrates an exemplary flow diagram of a method for fabricating an integrated device that includes a die substrate with a porous portion and a cavity.

Exemplary Flow Diagram of a Method for Fabricating an Integrated Device Comprising a Die Substrate With a Porous Portion In some implementations, fabricating an integrated device includes several processes. FIG. 10 illustrates an exemplary flow diagram of a method 1000 for providing or fabricating an integrated device. In some implementations, the method 1000 of FIG. 10 may be used to provide or fabricate the integrated device 400 of FIG. 4 described in the disclosure. However, the method 1000 may be used to provide or fabricate any of the integrated devices described in the disclosure.

It should be noted that the method of FIG. 10 may combine one or more processes in order to simplify and/or clarify the method for providing or fabricating an integrated device. In some implementations, the order of the processes may be changed or modified.

The method provides (at 1005) an integrated device that includes a die substrate, a die interconnection portion and a plurality of pads. Stage 1 of FIG. 9A, illustrates and describes a state after an integrated device is provided and/or fabricated. The integrated device 400 may include a die substrate portion 302 and a die interconnection portion 304. The die substrate portion 302 includes a die substrate 320 and an active region 308. The die interconnection portion 304 includes at least one dielectric layer 340, a plurality of die interconnects 342, a plurality of pad interconnects 307 and a passivation layer 305. In some implementations, a front side of the integrated device 400 may include the side that includes the passivation layer 305 and/or the plurality of pad interconnects 307. In some implementations, a back side of the integrated device 400 may include the side that includes the die substrate 320.

The method couples (at 1010) the integrated device to a carrier. Stage 2 of FIG. 9A, illustrates and describes an example of a state after the integrated device 400 is coupled to a carrier 900. The carrier 900 may be a tape. The carrier may include an adhesive. The front side of the integrated device 400 may be coupled to and touching the carrier 900. For example the passivation layer 305 and/or the plurality of pad interconnects 307 may be coupled to and touch the carrier 900.

The method forms (at 1015) a porous portion in the die substrate. Stage 3 of FIG. 9B, illustrates and describes an example of a state after at least one porous portion 422 is formed in the die substrate 320. The porous portion 422 may have a lower density than other portions of the die substrate 320. The die substrate 320 may include silicon. In some implementations, more than one porous portion may be formed in the die substrate 320. In some implementations, the porous portion may have different thicknesses.

A porosification process may be used to form and/or define porous portions in the die substrate 320. In some implementations, a porosification process may include dipping a silicon wafer in an electrolyte of 1:1 mixture of hydrofluoric acid (HF) and ethanol. A current is then passed, using a platinum rod as cathode while the silicon wafer acts as anode. The substrate is then annealed at 300-400° C. to strengthen the microstructure. An HF-resistant etch-stop layer (e.g., silicon nitride) is used for selective (masked) porosification. However, different implementations may use a porosification process that includes different steps, other steps and/or other materials.

Different porous portions may have the same porosity or different porosity. As a result of the porosification process, the porous portion may have different coefficients of thermal expansions (e.g., different from other porous portions, different from unporosified portions of the die substrate 320). The porosification process may change the density of the porous portion. In some implementations, one or more porous portions 422 may have a porosity in a range of about 30%-70%.

The method forms (at 1020) a plurality of through substrate vias in the die substrate, including a plurality of through substrate vias through a porous portion of the die substrate 320. Forming a plurality of through substrate vias may include forming a plurality of via cavities in the die substrate 320.

Stage 4 of FIG. 9B, illustrates and describes an example of a state after a plurality of via cavities 923 are formed in the die substrate 320. The plurality of via cavities 923 may include a first plurality via of cavities **923*a* and a second plurality of via cavities 923*b*. The first plurality of via cavities 923*a* may be formed through the porous portion 422 of the die substrate 320. The second plurality of via cavities 923*b* may be formed through the bulk portion of the die substrate 320 (e.g., unporosified portion of the die substrate 320). A laser process (e.g., laser ablation) may be used to form the plurality of via cavities 923. In some implementations, the plurality of via cavities 923 may extend into the die interconnection portion 304**.

Stage 5 of FIG. 9C, illustrates and describes an example of a state after a plurality of through substrate vias 323 are formed. A plating process may be used to form the plurality of substrate vias 323. The plurality of through substrate vias 323 may include a first plurality of through substrate vias **323*a* and a second plurality of through substrate vias 323*b*. The first plurality of through substrate vias 323*a* may be formed in the first plurality of via cavities 923*a*. The first plurality of through substrate vias 323*a* may extend through the porous portion 422 of the die substrate 320. The second plurality of through substrate vias 323*b* may be formed in the second plurality of via cavities 923*b*. The second plurality of through substrate vias 323*b* may extend through an unporosified portion of the die substrate 320. In some implementations, the plurality of through substrate vias 323 may extend into the die interconnection portion 304. The plurality of through substrate vias 323 may be coupled to the plurality of die interconnects 342**.

The method optionally forms (at 1025) a plurality of cavities in the die substrate. Stage 6 of FIG. 9C, illustrates and describes an example of a state after a plurality of cavities 223 are formed in the die substrate 320. A laser process (e.g., laser ablation) may be used to form the plurality of cavities 223. The plurality of cavities 223 may have the same depth or different depths. The plurality of cavities 223 may extend through the porous portion 422 and/or the unporosified portion of the die substrate 320.

The method forms (at 1030) a metallization portion (e.g., 303) that is coupled to the back side of the die substrate portion (e.g., 302). Forming the metallization portion may include forming at least one dielectric layer and a plurality of metallization interconnects. Stage 7 of FIG. 9D, illustrates and describes an example of a state after a plurality of metallization interconnects 932 are formed on the back side surface of the die substrate 320. A plating process may be used to form the plurality of metallization interconnects 932. The plurality of metallization interconnects 932 may be coupled to the plurality of through substrate vias 323.

Stage 8 of FIG. 9D, illustrates and describes an example of a state after a dielectric layer 330 is formed and coupled to the back side surface of the die substrate 320. The dielectric layer 330 may include a plurality of cavities 941. The dielectric layer 330 and the plurality of cavities 941 may be formed and/or provided using a deposition process, a lamination process, an exposure process and/or a development process.

Stage 9 of FIG. 9E, illustrates and describes an example of a state after a plurality of metallization interconnects 942 are formed. The plurality of metallization interconnects 942 may be coupled to the plurality of metallization interconnects 932. A plating process may be used to form the plurality of metallization interconnects 934. The plurality of metallization interconnects 932 and/or the plurality of metallization interconnects 942 may be represented as the plurality of metallization interconnects 332.

The method decouples (at 1035) the carrier from the integrated device. Stage 10 of FIG. 9E, illustrates and describes an example of a state after the carrier 900 is decoupled from the integrated device 400. The carrier 900 may be detached and/or peeled off from the integrated device 400.

The method couples (at 1040) a plurality of solder interconnects to the integrated device. Stage 11 of FIG. 9F, illustrates and describes an example of a state after the plurality of solder interconnects 306 are coupled to the plurality of pad interconnects 307. A solder reflow process may be used to form and couple the plurality of solder interconnects 306 to the plurality of pad interconnects 307.

Exemplary Electronic Devices

Figure 11:
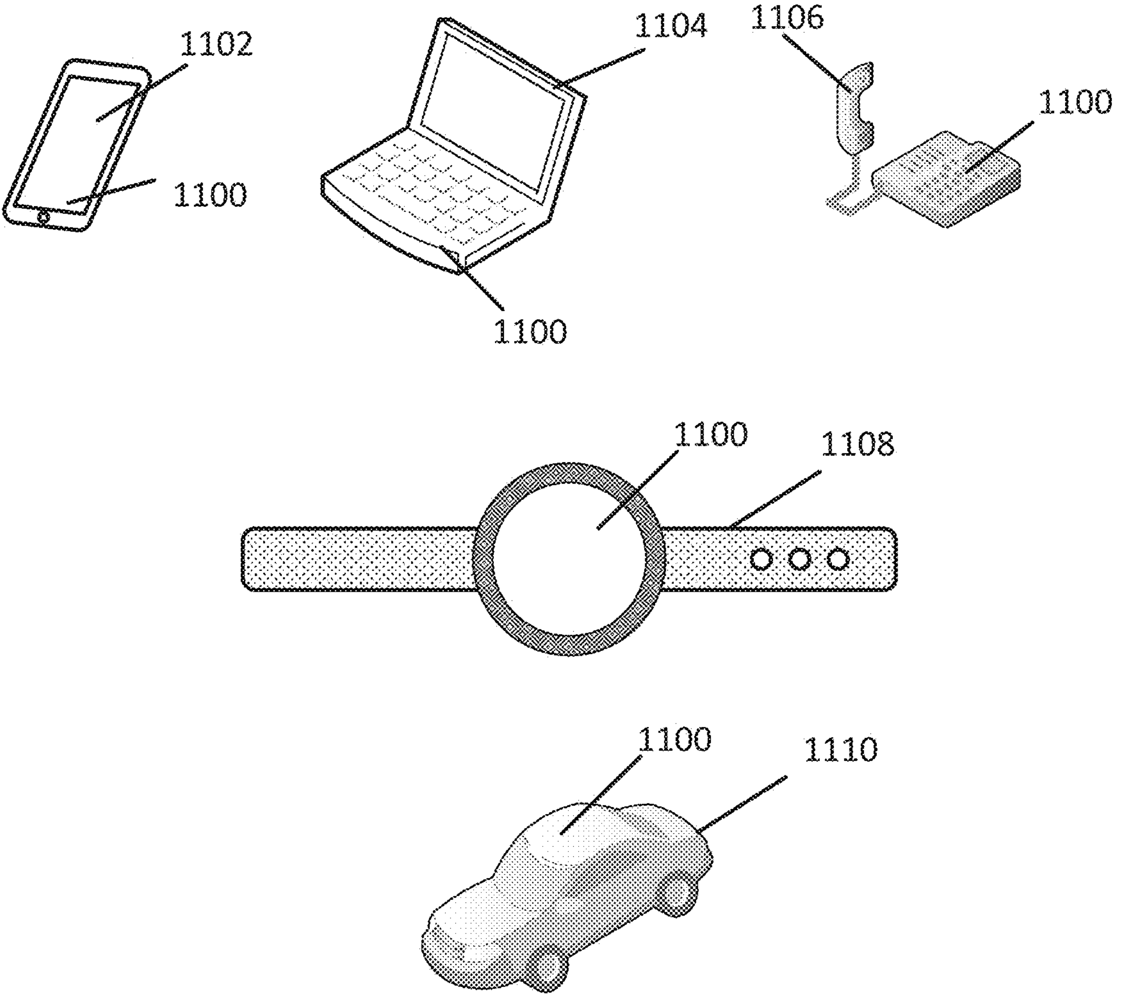
FIG. 11 illustrates various electronic devices that may integrate a die, an electronic circuit, an integrated device, an integrated passive device (IPD), a passive component, a package, and/or a device package described herein.

FIG. 11 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-7, 8A-8B, 9A-9F and/or 10-11 may be rearranged and/or combined into a single component, process, feature or function or embodied in several components, processes, or functions. Additional elements, components, processes, and/or functions may also be added without departing from the disclosure. It should also be noted FIGS. 1-7, 8A-8B, 9A-9F and/or 10-11 and its corresponding description in the present disclosure is not limited to dies and/or ICs. In some implementations, FIGS. 1-7, 8A-8B, 9A-9F and/or 10-11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object that is coupled to another object may be coupled to at least part of the another object. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising an interposer and a first integrated device coupled to the interposer through a first plurality of solder interconnects. The interposer comprises a silicon substrate comprising a porous portion; and a plurality of via interconnects extending through the porous portion of the silicon substrate.

Aspect 2: The package of aspect 1, wherein the silicon substrate includes an unporosified portion, and wherein the porous portion of the silicon substrate includes a lower density than the unporosified portion of the silicon substrate.

Aspect 3: The package of aspects 1 through 2, wherein the porous portion includes a coefficient of thermal expansion (CTE) in a range of about 5-8 parts per million per Celsius degree (ppm/C).

Aspect 4: The package of aspects 1 through 3, wherein the porous portion comprises a first porous portion comprising a first density; and a second porous portion comprising a second density.

Aspect 5: The package of aspect 4, wherein the first porous portion comprises a first coefficient of thermal expansion (CTE), and wherein the second porous portion comprises a second coefficient of thermal expansion (CTE).

Aspect 6: The package of aspect 5, wherein the silicon substrate includes an unporosified portion comprising a third coefficient of thermal expansion (CTE) that is different from the first coefficient of thermal expansion (CTE) and the second coefficient of thermal expansion (CTE).

Aspect 7: The package of aspects 1 through 6, wherein the porous portion comprises a porosity in a range of about 30-70 percent.

Aspect 8: The package of aspects 1 through 7, further comprising a second integrated device coupled to the interposer through a second plurality of solder interconnects.

Aspect 9: The package of aspect 8, wherein the porous portion comprises a first porous portion comprising a first density; and a second porous portion comprising a second density, and wherein the plurality of via interconnects comprises: a first plurality of via interconnects extending through the first porous portion of the silicon substrate; and a second plurality of via interconnects extending through the second porous portion of the silicon substrate.

Aspect 10: The package of aspects 1 through 9, wherein the porous portion includes the entire silicon substrate.

Aspect 11: The package of aspects 1 through 10, wherein the first integrated device comprises a die substrate comprising a porous portion; a plurality of through substrate vias extending through the porous portion of the die substrate; and a die interconnection portion coupled to the die substrate.

Aspect 12: The package of aspect 11, wherein the die substrate includes an unporosified portion, and wherein the porous portion of the die substrate includes a lower density than the unporosified portion of the die substrate.

Aspect 13: The package of aspect 12, wherein the porous portion of the die substrate comprises a first porous portion comprising a first coefficient of thermal expansion (CTE), and a second porous portion comprising a second coefficient of thermal expansion (CTE), wherein the unporosified portion of the die substrate comprises a third coefficient of thermal expansion (CTE) that is different from the first coefficient of thermal expansion (CTE) and the second coefficient of thermal expansion (CTE).

Aspect 14: The package of aspects 11 through 13, wherein the first integrated device further comprises a metallization portion coupled to a back side of the die substrate.

Aspect 15: The package of aspect 14, wherein the metallization portion comprises at least one dielectric layer; and a plurality of metallization interconnects coupled to the plurality of through substrate vias.

Aspect 16: The package of aspects 14 through 15, further comprising a second integrated device coupled to the metallization portion of the first integrated device through a second plurality of solder interconnects.

Aspect 17: The package of aspects 11 through 16, further comprising at least one cavity in the die substrate.

Aspect 18: The package of aspects 1 through 17, further comprising a second integrated device coupled to the interposer through a second plurality of solder interconnects.

Aspect 19: The package of aspects 1 through 18, further comprising a substrate coupled to the interposer through a second plurality of solder interconnects.

Aspect 20: The package of aspects 1 through 19, wherein the package is part of a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:

an interposer comprising:

a silicon substrate comprising a porous portion and an unporosified portion, wherein the porous portion of the silicon substrate has a lower density than the unporosified portion of the silicon substrate; and a plurality of via interconnects extending through the porous portion of the silicon substrate; and a first integrated device coupled to the interposer through a first plurality of solder interconnects.

2. The package of claim 1, further comprising another plurality of via interconnects extending through the unporosified portion of the silicon substrate.

3. The package of claim 1, wherein the porous portion includes a coefficient of thermal expansion (CTE) in a range of about 5-8 parts per million per Celsius degree (ppm/C).

4. The package of claim 1, wherein the porous portion comprises:

a first porous portion comprising a first density; and a second porous portion comprising a second density that is different from the first density.

5. The package of claim 4, wherein the first porous portion comprises a first coefficient of thermal expansion (CTE), and wherein the second porous portion comprises a second coefficient of thermal expansion (CTE).

6. The package of claim 5, wherein the silicon substrate includes an unporosified portion comprising a third coefficient of thermal expansion (CTE) that is different from the first coefficient of thermal expansion (CTE) and the second coefficient of thermal expansion (CTE).

7. The package of claim 1, wherein the porous portion comprises a porosity in a range of about 30-70 percent.

8. The package of claim 1, further comprising a second integrated device coupled to the interposer through a second plurality of solder interconnects.

9. The package of claim 8,
wherein the porous portion comprises:
a first porous portion comprising a first density; and
a second porous portion comprising a second density, and
wherein the plurality of via interconnects comprises:
a first plurality of via interconnects extending through the first porous portion of the silicon substrate; and
a second plurality of via interconnects extending through the second porous portion of the silicon substrate.

10. The package of claim 1, wherein the porous portion comprises porosified silicon.

11. The package of claim 1, wherein the first integrated device comprises:
a die substrate comprising a die porous portion;
a plurality of through substrate vias extending through the die porous portion of the die substrate; and
a die interconnection portion coupled to the die substrate.

12. The package of claim 11,
wherein the die substrate includes an unporosified portion, and
wherein the die porous portion of the die substrate includes a lower density than the unporosified portion of the die substrate.

13. The package of claim 12, wherein the die porous portion of the die substrate comprises:
a first porous portion comprising a first coefficient of thermal expansion (CTE), and
a second porous portion comprising a second coefficient of thermal expansion (CTE),
wherein the unporosified portion of the die substrate comprises a third coefficient of thermal expansion (CTE) that is different from the first coefficient of thermal expansion (CTE) and the second coefficient of thermal expansion (CTE).

14. The package of claim 11, wherein the first integrated device further comprises a metallization portion coupled to a back side of the die substrate.

15. The package of claim 14, wherein the metallization portion comprises:
at least one dielectric layer; and
a plurality of metallization interconnects coupled to the plurality of through substrate vias.

16. The package of claim 14, further comprising a second integrated device coupled to the metallization portion of the first integrated device through a second plurality of solder interconnects.

17. The package of claim 11, further comprising at least one cavity in the die substrate.

18. The package of claim 11, further comprising a second integrated device coupled to the interposer through a second plurality of solder interconnects.

19. The package of claim 1, further comprising a substrate coupled to the interposer through a second plurality of solder interconnects.

20. The package of claim 1, wherein the package is part of a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *